United States Patent
Hayashi et al.

(10) Patent No.: US 8,446,734 B2
(45) Date of Patent: May 21, 2013

(54) CIRCUIT BOARD AND MOUNTING STRUCTURE

(75) Inventors: Katsura Hayashi, Yasu (JP); Yutaka Tsukada, Yasu (JP); Kimihiro Yamanaka, Yasu (JP); Masaharu Shirai, Yasu (JP); Isamu Kirikihira, Yasu (JP)

(73) Assignee: Kyocera Corporation, Kyoto (JP)

(*) Notice: Subject to any disclaimer, the term of this patent is extended or adjusted under 35 U.S.C. 154(b) by 638 days.

(21) Appl. No.: 12/295,582

(22) PCT Filed: Mar. 30, 2007

(86) PCT No.: PCT/JP2007/057288
§ 371 (c)(1),
(2), (4) Date: Jun. 22, 2010

(87) PCT Pub. No.: WO2007/114392
PCT Pub. Date: Oct. 11, 2007

(65) Prior Publication Data
US 2010/0259910 A1    Oct. 14, 2010

(30) Foreign Application Priority Data

Mar. 30, 2006 (JP) ................. 2006-095810
Mar. 30, 2006 (JP) ................. 2006-096057
Sep. 28, 2006 (JP) ................. 2006-264018

(51) Int. Cl.
*H05K 7/00* (2006.01)

(52) U.S. Cl.
USPC ........... 361/783; 361/760; 428/105; 428/114; 428/292.1; 428/372; 428/375; 438/125; 422/74; 422/285; 422/237; 427/379; 427/180; 257/700; 442/181; 442/187; 442/117; 442/294

(58) Field of Classification Search ........ 361/783, 361/760; 428/105, 114, 292.1, 372, 373, 428/375, 476; 438/125; 422/74, 285, 237; 427/379, 427/180; 257/700; 442/181, 187, 117, 294
See application file for complete search history.

(56) References Cited

U.S. PATENT DOCUMENTS

| | | | | |
|---|---|---|---|---|
| 4,900,848 A | * | 2/1990 | Saito et al. | 549/517 |
| 4,957,995 A | * | 9/1990 | Saito et al. | 528/99 |
| 4,981,753 A | | 1/1991 | Ohta et al. | 428/224 |

(Continued)

FOREIGN PATENT DOCUMENTS

| | | |
|---|---|---|
| JP | 61-258043 | 11/1986 |
| JP | 03-090671 | 4/1991 |

(Continued)

OTHER PUBLICATIONS

Japanese language office action dated Jul. 12, 2011 and its English language translation for corresponding Japanese application 2007082919 cites the foreign patent documents above.

*Primary Examiner* — Xiaoliang Chen
(74) *Attorney, Agent, or Firm* — DLA Piper LLP (US)

(57) ABSTRACT

The invention relates to a circuit board having high density circuit and excellent connection reliability and lamination reliability. A resin fabric cloth (4) is provided by arranging single fibers (4a) or fiber bundles composed of a plurality of single fibers, which single fiber has a linear thermal expansion coefficient smaller than that of silicon, at least in two directions and alternately weaving them. In the board, the resin fabric cloth is covered with a resin portion (5) made of a resin material having a linear thermal expansion coefficient larger than that of silicon.

4 Claims, 15 Drawing Sheets

U.S. PATENT DOCUMENTS

| | | | |
|---|---|---|---|
| 5,013,773 A * | 5/1991 | Nomura et al. | 523/222 |
| 5,206,078 A * | 4/1993 | Inoguchi et al. | 442/187 |
| 5,300,592 A * | 4/1994 | Kanagawa et al. | 525/488 |
| 5,382,309 A * | 1/1995 | Seibold et al. | 156/242 |
| 5,624,386 A * | 4/1997 | Tailor et al. | 602/16 |
| 5,677,045 A * | 10/1997 | Nagai et al. | 442/294 |
| 5,698,725 A * | 12/1997 | Hayashi et al. | 556/413 |
| 5,741,446 A * | 4/1998 | Tahara et al. | 264/1.9 |
| 5,777,391 A * | 7/1998 | Nakamura et al. | 257/778 |
| 5,919,525 A * | 7/1999 | Appelt et al. | 427/379 |
| 5,997,983 A * | 12/1999 | Caron et al. | 428/105 |
| 6,109,586 A * | 8/2000 | Hoek | 248/476 |
| 6,114,005 A * | 9/2000 | Nagai et al. | 428/114 |
| 6,131,512 A * | 10/2000 | Verlinden et al. | 101/368 |
| 6,207,595 B1 * | 3/2001 | Appelt et al. | 442/117 |
| 6,384,151 B1 * | 5/2002 | Matsukawa et al. | 525/445 |
| 6,387,205 B1 * | 5/2002 | Appelt et al. | 156/307.7 |
| 6,419,981 B1 * | 7/2002 | Novich et al. | 427/180 |
| 6,515,081 B2 * | 2/2003 | Oosedo et al. | 525/531 |
| 6,733,845 B1 * | 5/2004 | Caramaro et al. | 427/477 |
| 6,849,684 B2 * | 2/2005 | Poppe et al. | 524/539 |
| 6,949,289 B1 * | 9/2005 | Lawton et al. | 428/372 |
| 7,001,181 B2 * | 2/2006 | Kangasniemi et al. | 433/81 |
| 7,049,253 B1 * | 5/2006 | Kimura et al. | 442/195 |
| 2001/0000738 A1 * | 5/2001 | Mathieu | 428/70 |
| 2001/0004536 A1 * | 6/2001 | Ikegami | 438/125 |
| 2002/0085888 A1 * | 7/2002 | Velpari et al. | 408/1 R |
| 2002/0086598 A1 * | 7/2002 | Velpari et al. | 442/74 |
| 2002/0123285 A1 * | 9/2002 | Dana et al. | 442/237 |
| 2002/0128371 A1 * | 9/2002 | Poppe et al. | 524/494 |
| 2002/0172021 A1 * | 11/2002 | Seri et al. | 361/760 |
| 2002/0193027 A1 * | 12/2002 | Dana et al. | 442/285 |
| 2003/0012529 A1 * | 1/2003 | Kobayashi et al. | 385/103 |
| 2003/0059610 A1 * | 3/2003 | Khavkine et al. | 428/373 |
| 2003/0178227 A1 * | 9/2003 | Matsunaga et al. | 174/257 |
| 2004/0043206 A1 * | 3/2004 | Bush et al. | 428/297.4 |
| 2004/0173942 A1 * | 9/2004 | Kobayashi et al. | 264/400 |
| 2004/0185239 A1 * | 9/2004 | Nakamura et al. | 428/292.4 |
| 2004/0226641 A1 * | 11/2004 | Akiyama et al. | 152/451 |
| 2005/0014035 A1 * | 1/2005 | Nakagiri et al. | 428/901 |
| 2005/0025967 A1 * | 2/2005 | Lawton et al. | 428/375 |
| 2005/0072056 A1 * | 4/2005 | Famy et al. | 52/21 |
| 2005/0218503 A1 * | 10/2005 | Abe et al. | 257/700 |
| 2005/0229532 A1 * | 10/2005 | Teng | 52/736.3 |
| 2005/0252682 A1 * | 11/2005 | Shimoto et al. | 174/260 |
| 2006/0182947 A1 * | 8/2006 | Jerri et al. | 428/316.6 |
| 2007/0093587 A1 * | 4/2007 | Shen et al. | 524/443 |
| 2007/0116938 A1 * | 5/2007 | Tobita et al. | 428/292.1 |
| 2007/0141268 A1 * | 6/2007 | Brink | 427/407.1 |
| 2007/0144134 A1 * | 6/2007 | Kajihara | 57/229 |
| 2007/0190879 A1 * | 8/2007 | Gondoh et al. | 442/181 |
| 2008/0164057 A1 * | 7/2008 | Mori et al. | 174/262 |

FOREIGN PATENT DOCUMENTS

| | | |
|---|---|---|
| JP | 05-082971 | 4/1993 |
| JP | 5082971 A | 4/1993 |
| JP | 2001-028475 | 1/2001 |
| JP | 2001028475 A | 1/2001 |
| JP | 2001-089953 | 4/2001 |
| JP | 2001089953 A | 4/2001 |
| JP | 2001-207375 | 8/2001 |
| JP | 2001207375 A | 8/2001 |
| JP | 2002-020932 | 1/2002 |
| JP | 2002020932 A | 1/2002 |
| JP | 2002111215 A | 4/2002 |
| JP | 2002-198658 | 7/2002 |
| JP | 2002-212394 | 7/2002 |
| JP | 2003201641 A | 7/2003 |
| JP | 2003297873 A | 10/2003 |
| JP | 2004-043690 | 2/2004 |
| JP | 2004043690 A | 2/2004 |
| JP | 2004179171 A | 6/2004 |
| JP | 2005-086164 | 3/2005 |
| JP | 2005299053 A | 10/2005 |

* cited by examiner

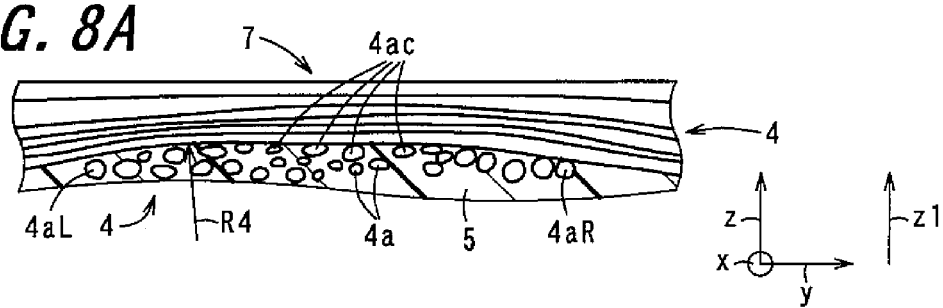

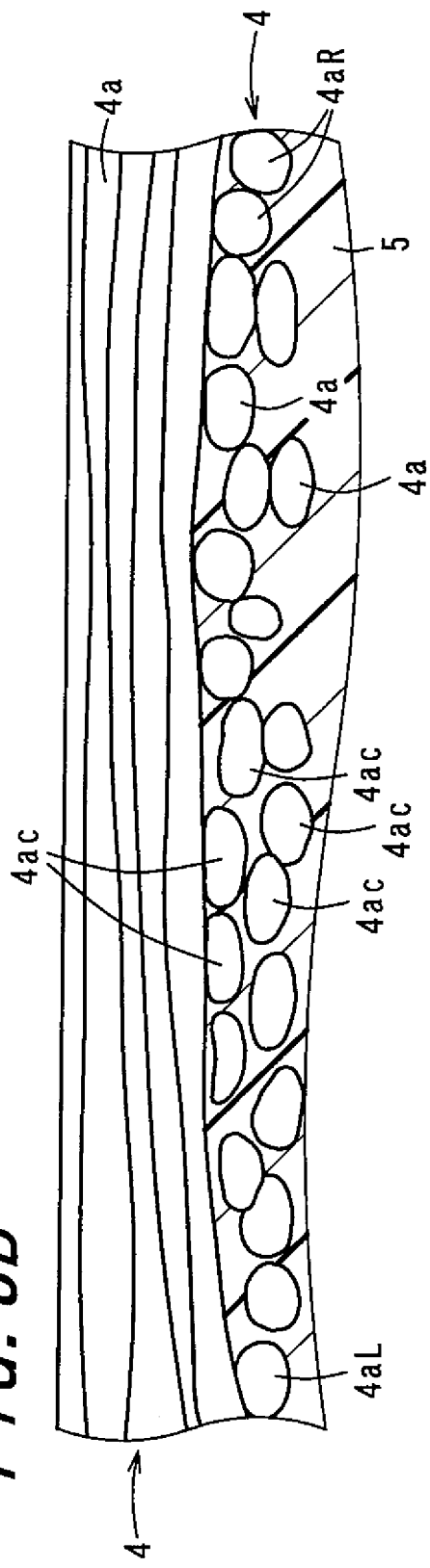

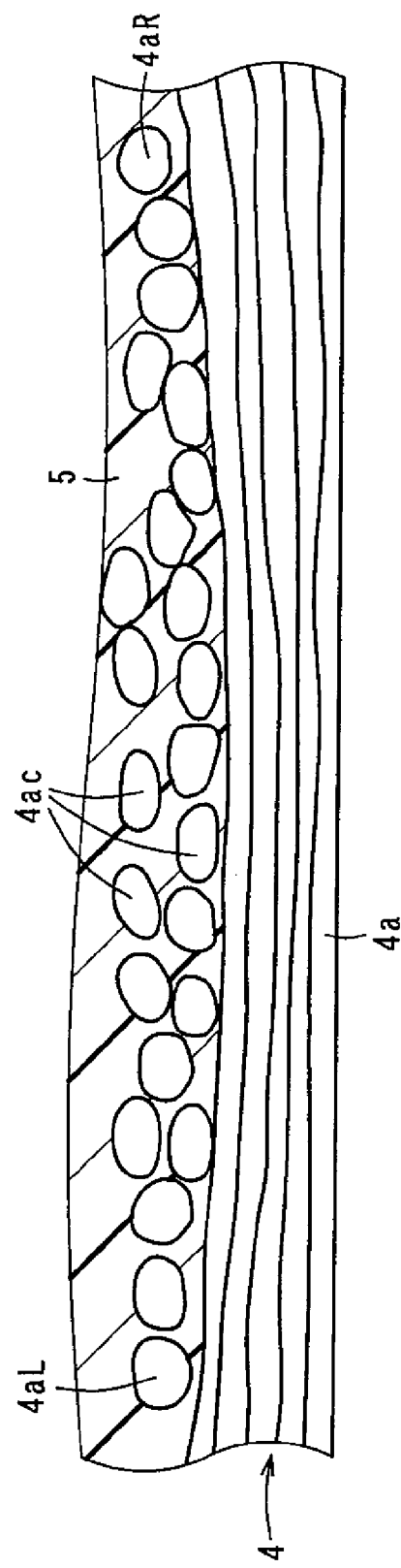

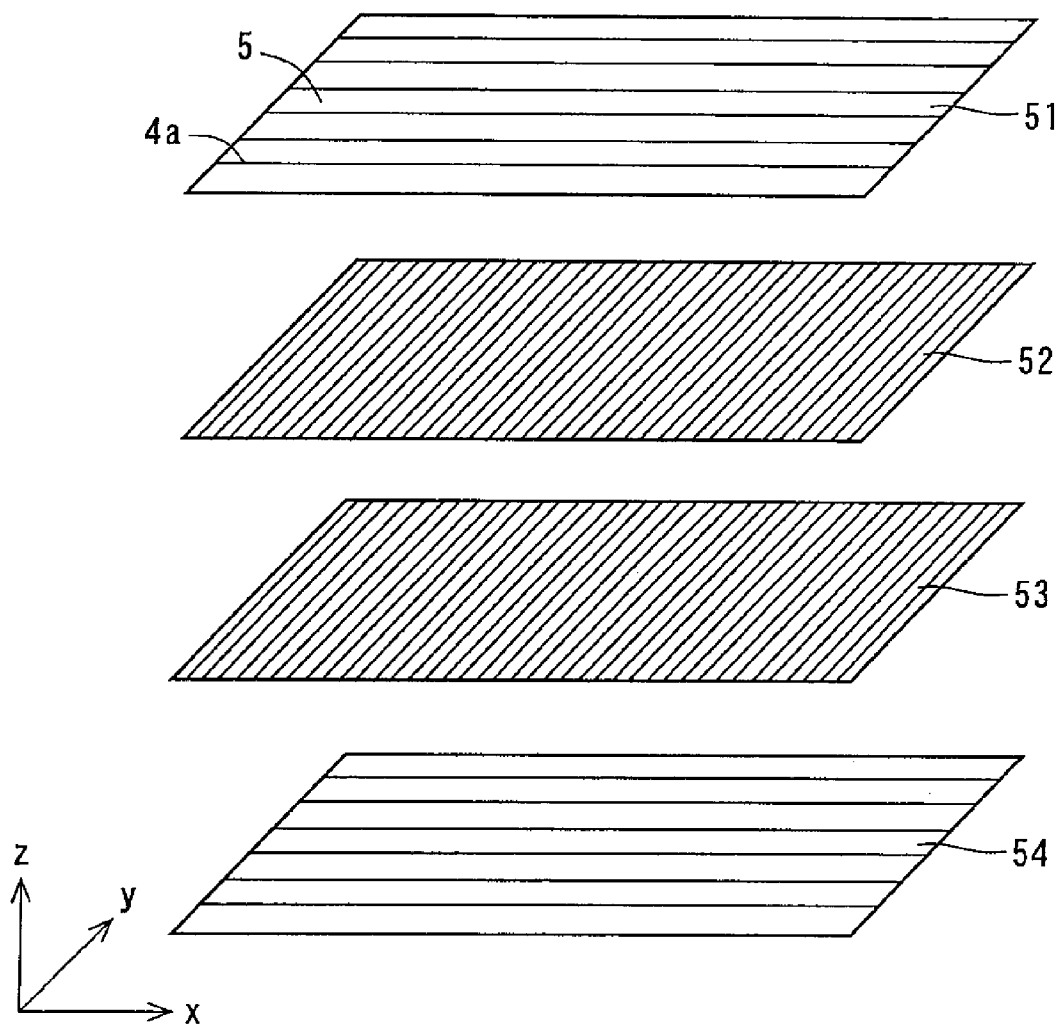

CIRCUIT BOARD AND MOUNTING STRUCTURE

BACKGROUND OF THE INVENTION

1. Field of the Invention

The present invention relates to a circuit board for use in various audio-visual (AV for short) equipment, household electrical appliances, communications equipment, computer apparatuses, peripheral equipment thereof, and so forth, and more particularly to a circuit board on which a silicon chip is flip-chip mounted and a mounting structure.

2. Description of the Related Art

A circuit board has hitherto been used for a hybrid integrated circuit that constitutes a predetermined electronic circuit by mounting a multiplicity of active elements as typified by a semiconductor device such as IC (Integrated Circuit) and LSI (Large Scale Integration) and passive elements such as capacitative elements and resistive elements. This circuit board is customarily manufactured as follows. (1) A substrate constituted by bonding a copper foil to both of upper and lower surfaces of an insulating substrate formed of an epoxy resin-impregnated glass cloth, namely a both-side copper-clad substrate, is processed into a circuit conductor in the form of circuit pattern by the subtractive method. (2) After that, a through-hole which passes completely through the circuit conductor and the insulating substrate is created by a drill, and a conductor layer is laminated inside the through-hole by the plating method thereby to form a through conductor, whereupon a base body is fabricated. (3) On a main surface of the base body is stacked an insulating layer called solder resist. In this way, a circuit board is manufactured (refer to Japanese Unexamined Patent Publications JP-A 2002-198658 and JP-A 2002-212394, for example).

Alternatively, in order to obtain a higher circuit density, a build-up portion may be formed by repeating the following process steps. That is, an insulating layer made of epoxy resin or the like material is stacked on the main surface of the base body fabricated through the step (2) described above, and a through-hole (via-hole) is created in the insulating layer by application of laser light. After that, a conductor layer is formed inside the through-hole by the plating method, and a circuit conductor is formed on a surface of the insulating layer. Also in this way, a circuit board may be manufactured (refer to Japanese Unexamined Patent Publication JP-A 2005-86164, for example).

A multilayer circuit board is customarily manufactured as follows. An insulating layer is formed on an inner-layer circuit substrate having an inner layer circuit formed therein. A metal layer is formed thereon and a hole is so formed as to pass completely through the circuit board as a whole, or a via-hole is so formed as to reach the inner layer circuit thereby to provide electrical connection between the inner layer circuit and a metal foil. Then, unnecessary parts of the metal foil are removed by means of etching. However, a typical insulating material exhibits a thermal expansion coefficient of approximately 16 ppm/° C., whereas a silicon chip exhibits a thermal expansion coefficient of 3 ppm/° C.; that is, there is a significant difference therebetween. Recently, in keeping with advancement of higher speed, higher performance LSI, there is a tendency to use a low-dielectric-constant material for a silicon surface. Although a material which exhibits the lowest dielectric constant is air, due to a problem associated with circuit maintenance, there is a trend to use, as a candidate low-dielectric-constant material, a material containing many bubbles. A low-dielectric-constant material containing many bubbles is low in strength. Therefore, if a silicon chip employing such a bubble-containing low-dielectric-constant material is flip-chip mounted on a substrate of conventional design, due to the difference in thermal expansion coefficient between the board and the silicon chip, a crack may be developed in the low-dielectric-constant material on the silicon chip surface during a cooling process subsequent to the flip-chip mounting. This gives rise to a problem of occurrence of a break in a circuit.

Accordingly, a package for mounting a silicon chip employing a bubble-containing low-dielectric-constant material needs to be so designed that a difference in thermal expansion coefficient with respect to the silicon chip is minimized to avoid occurrence of thermal stress in the silicon chip. The package substrate is thus required to exhibit a thermal expansion coefficient which is nearly the same as that of the silicon chip.

Moreover, LSI is designed to deal with lots of data at one time and thus tends to grow in size. An increase in size of LSI necessitates an increase in number of I/O (Input/Output) for performing data input and data output. While the number of I/O is currently several thousand, it is expected to reach ten thousand in the future. Therefore, a part of connection between a semiconductor element and a circuit board (bump) tends to be down-sized, and more specifically, a bump which is currently 100 μm in diameter and 220 μm in pitch will hereinafter be required to have a diameter in a range of 50 μm or above and 75 μm or below and a pitch in a range of 100 μm or above and 125 μm or below. Bump downsizing leads to deterioration of mechanical strength and to a decrease in silicon chip-to-board distance. After all, due to the difference in thermal expansion coefficient between the board and the silicon chip, rupture takes place in the bump as the result of repeated heating and cooling operations during the use of the product, which results in a break in a circuit. This gives rise to a problem of system halt.

Accordingly, a package for mounting a silicon chip which has a larger number of I/O and thus requires a bump of smaller size needs to be so designed that a difference in thermal expansion coefficient with respect to the silicon chip is minimized to avoid occurrence of thermal stress in the silicon chip. The circuit board is thus required to exhibit a thermal expansion coefficient which is nearly the same as that of the silicon chip.

However, the following problems are posed. In a typical insulating substrate formed of an epoxy resin-impregnated glass cloth, the thermal expansion coefficient of the glass cloth is so large that it is difficult to obtain a thermal expansion coefficient which is equivalent to that of the silicon chip. Furthermore, because of the difficulty in performing drilling on the glass cloth with use of a drill or laser light, there is a limit to the extent of through-conductor microfabrication. In addition, it is difficult to form through conductors of uniform pore diameter due to lack of uniformity in the thickness of the glass cloth.

SUMMARY OF THE INVENTION

The invention has been devised in view of the problems with the conventional art, and accordingly its object is to provide a circuit board that has high density circuit and excellent connection reliability and lamination reliability, and a mounting structure.

The invention provides a circuit board comprising:
an insulating substrate; and
an electrically conductive section formed on the insulating substrate, to which is electrically connected a chip component, the insulating substrate comprising a base material composed of a single fiber or a plurality of single fibers and a resin portion for covering the base material, the single fiber being made of a resin material which is smaller in linear expansion coefficient than a material used for the chip component, and the resin portion being made of a resin material which is larger in linear expansion coefficient than the material used for the chip component.

In the invention, it is preferable that the chip component is a silicon chip.

In the invention, it is preferable that the base material is composed of a fabric cloth formed by weaving the single fibers or the fiber bundles together.

In the invention, it is preferable that the single fiber is formed in wavelike shape in conformity with a pitch at which the fabric cloth is woven, and that the length of the single fiber corresponding to one waveshape period is greater than 1 time but less than or equal to 1.20 times with respect to the period of the waveshape.

In the invention, it is preferable that the fiber bundle is formed in such a manner that a cross-sectional profile of the fiber bundle sectioned along a virtual plane perpendicular to its longitudinal direction takes on a horizontally long, flat shape.

In the invention, it is preferable that, out of the fiber bundles crossing in two directions, the fiber bundle in one direction is so designed that the number of the single fibers grouped together in the proximity to the fiber bundle in the other direction is set to be substantially the same number as the number of single fibers other than the grouped single fibers.

In the invention, it is preferable that the base material is constituted by arranging a plurality of arrays of the single fibers or the fiber bundles.

In the invention, it is preferable that the single fiber has a Young's modulus of 10 GPa or above, and the resin material has a Young's modulus of 0.05 GPa or above.

In the invention, it is preferable that a linear expansion coefficient in the longitudinal direction of the single fiber falls in a range of −10 ppm/° C. or above and 0 ppm/° C. or below (25° C. or above and 200° C. or below) and the linear expansion coefficient of the resin material falls in a range of 10 ppm/° C. or above and 60 ppm/° C. or below (25° C. or above and 200° C. or below).

In the invention, it is preferable that the resin material is made of epoxy resin containing 20 wt % or above and 80 wt % or below of nonmetallic inorganic filler.

In the invention, it is preferable that a ratio of the base material to the substrate in terms of volume falls in a range of 40% by volume or above and 70% by volume or below.

In the invention, it is preferable that the single fiber has, on its surface region, a groove formed along a longitudinal direction thereof.

In the invention, it is preferable that the insulating substrate has, at least on one main surface thereof, a circuit layer formed by stacking insulating layers and circuit layers in an alternating manner.

In the invention, it is preferable that the single fiber is a resin fiber made of any of wholly aromatic polyamide, wholly aromatic polyester, and polyparaphenylene benzobisoxazole.

The invention provides a circuit board comprising:
a substrate having
a fabric cloth including fiber bundles, each of which is composed of a plurality of single fibers, the fiber bundles being arranged in a first direction and a second direction that differs from the first direction so that the fiber bundles intersect one another, and
a resin portion for covering the fabric cloth; and
a circuit conductor formed on the substrate, wherein
the single fiber which constitutes the fiber bundle is so designed that, in regard to a width in a direction perpendicular to a direction of thickness of the substrate, the width in a crossing region where the fiber bundles cross each other is made larger than the width in a noncrossing region where the fiber bundles do not cross each other.

In the invention, it is preferable that the fabric cloth is wholly housed in the resin portion.

The invention provides a circuit board comprising:
a substrate having
a fabric cloth including fiber bundles, is the fiber bundles composed of a plurality of single fibers, being arranged in a first direction and a second direction that differs from the first direction so that a plurality of the fiber bundles intersect one another, and
a resin portion for covering the fabric cloth; and
a circuit conductor formed on the substrate, wherein
the single fiber which constitutes the fiber bundle is so designed that, in regard to a thickness in a direction parallel to a direction of thickness of the substrate, the thickness in a crossing region where the fiber bundles cross each other is made smaller than the thickness in a noncrossing region where the fiber bundles do not cross each other.

In the invention, it is preferable that the fabric cloth is wholly housed in the resin portion.

The invention provides a mounting structure comprising:
the circuit board; and
a semiconductor element flip-chip mounted on the circuit board.

In the circuit board embodying the invention, the fabric cloth, which is formed by arranging and weaving the single fibers or the fiber bundles composed of a plurality of the single fibers that are lower in linear expansion coefficient than the material used for the chip component at least in two directions, is covered with the resin portion made of the resin material that is higher in linear expansion coefficient than the material used for the chip component. By virtue of this constitution, the following advantages can be gained.

The thermal expansion coefficient of the circuit board as a whole can be made substantially identical with that of the material used for the chip. Accordingly, there is no difference in thermal expansion between the semiconductor element and the circuit board. Therefore, even if temperature variation takes place due to a change in switching mode in the semiconductor element, it never occurs that a strain resulting from thermal expansion difference appears in the part of connection between the circuit board and the semiconductor element, wherefore connection reliability, namely product reliability can be maintained. Thus, the circuit board of the invention is free from occurrence of a break that is a problem associated with a case of conducting flip-chip mounting of a semiconductor chip employing a low-dielectric-constant insulating material. This makes it possible to take full advantage of the performance capability of the semiconductor element. In consequence, it is possible to realize a circuit board that has high-density circuit and is excellent in connection reliability and lamination reliability.

Moreover, according to the invention, the chip component is a silicon chip. The reason for using the single fiber which is lower in linear expansion coefficient than silicon is as follows. A copper circuit portion which is inevitably included in the circuit board exhibits a thermal expansion coefficient of 16 ppm/° C. Even in a case where the circuit board includes the copper circuit portion, by virtue of such a single fiber, the thermal expansion coefficient of the circuit board in itself can be kept substantially identical with that of silicon. When a silicon chip is mounted on such a circuit board, it never occurs that a strain resulting from thermal expansion difference appears in the part of connection between them, wherefore connection reliability can be maintained.

Moreover, according to the invention, in a case where the base material is composed of the fabric cloth which is formed by weaving the single fibers or the fiber bundles, the single fibers or the fiber bundles are so disposed as to undulate toward one side and the other side, seen in the direction of thickness of the substrate. The larger is the undulation, the more likely it is that an effect of "spring" (referred to as "springy effect") is derived from the undulation. Therefore, the use of a fiber of low thermal expansion coefficient becomes less advantageous. As to a value indicative of the extent of the undulation, it is preferable that the length of the single fiber corresponding to one waveform period is greater than 1 time but smaller than or equal to 1.20 times with respect to the period of a waveshape. In a case where this value is "1", it is indicated that the fibers are free of undulation; that is, kept in a straight state. On the other hand, in a case where this value is less than "1", the extent of transformation of the fibers toward one side and the other side in the thickness direction is so small that the thermal expansion coefficient of the circuit board can be kept low. However, there arises a problem that the resin is prone to peel off at the interface between the fibers stacked together.

In a case where the value is greater than "1" but smaller than or equal to "1.20", because of a small springy effect, it never occurs that the resin peels off at the interface, and the effect of achieving lowness of thermal expansion coefficient is sufficient. Optimally the value should fall in a range of 1.02 or above and 1.10 or below. The springy effect can be kept as small as possible in this optimal value range. This makes it possible to prevent occurrence of peeling-off of the resin at the interface without fail, and thereby enhance the thermal-expansion-coefficient lowering effect even further. On the other hand, if the value exceeds "1.20", the springy effect becomes so large that, even if a fiber having as low a thermal expansion as possible is used, it is difficult to obtain, in the board taken as a whole, a low thermal expansion coefficient which is substantially identical with that of the semiconductor element.

Moreover, according to the invention, in a case where the base material is composed of the fabric cloth which is formed by weaving the single fibers or the fiber bundles, by imparting a horizontally long, flat-shaped cross-sectional profile to the fiber bundle, it is possible to increase a contact portion between the single fibers crossing in two directions, and thereby prevent, insofar as possible, the fibers from undergoing deformation in the vicinity of the fiber intersection point. In other words, it is possible to lessen the springy effect occurring in the vicinity of the fiber intersection point.

In contrast, in a case where the fiber bundle does not have a horizontally long, flat-shaped cross-sectional profile, the contact portion between the single fibers in the vicinity of the fiber intersection point is so small that fiber deformation is observed in the vicinity of the fiber intersection point. In this case, the springy effect is observed at this portion. Therefore, even if any fiber having a low thermal expansion is used, it is difficult to obtain a low thermal expansion coefficient of the whole substrate which is substantially identical with that of the semiconductor element.

Moreover, according to the invention, in a case where the base material is composed of the fabric cloth which is formed by weaving the single fibers or the fiber bundles, the fiber bundle in one direction is so designed that the number of the single fibers grouped together in the proximity to the fiber bundle in the other direction is substantially the same as, or not less than the number of single fibers other than the grouped single fibers. This makes it possible to increase the contact portion between the single fibers crossing in two directions, and thereby prevent, insofar as possible, the fibers from undergoing deformation in the vicinity of the fiber intersection point. Accordingly, even if a change in temperature takes place, it never occurs that a strain resulting from thermal expansion difference appears in the part of connection between the circuit board and the semiconductor element, wherefore connection reliability can be maintained.

In contrast, in a case where the number of the single fibers grouped together is smaller than the number of single fibers other than the grouped single fibers, the contact portion between the single fibers crossing in two directions is so small that fiber deformation is observed in the vicinity of the fiber intersection point, in consequence whereof there results the springy effect in this region. In this case, even if a fiber having as low a thermal expansion as possible is used, it is difficult to obtain, in the circuit board taken as a whole, a low thermal expansion coefficient which is substantially identical with that of the semiconductor element.

Moreover, according to the invention, the circuit board of the invention can be implemented with use of a single fiber having a Young's modulus of 10 GPa or above and a resin material having a Young's modulus of 0.05 GPa or above.

Moreover, according to the invention, by adjusting the linear expansion coefficient in the longitudinal direction of the single fiber to fall in a range of −10 ppm/° C. or above and 0 ppm/° C. or below, as well as adjusting the linear expansion coefficient of the resin material to fall in a range of 10 ppm/° C. or above and 60 ppm/° C. or below, and also fulfilling other conditions, it is possible to reduce the thermal expansion coefficient of the circuit board as a whole to a level equal to that of the thermal expansion coefficient of the semiconductor element.

Moreover, according to the invention, the circuit board can be implemented with use of a resin material made of epoxy resin containing 20 wt % or above and 80 wt % or below of nonmetallic inorganic filler.

Moreover, according to the invention, by adjusting the ratio of the base material to the insulating substrate in terms of volume to fall in a range of 40% by volume or above and 70% by volume or below, it is possible to enhance the effect of keeping the thermal expansion coefficient of the insulating substrate as a whole low. If the volume proportion of the base material is less than 40% by volume, the effect of keeping the thermal expansion coefficient of the insulating substrate as a whole low is insufficient. On the other hand, if the volume proportion of the base material exceeds 70% by volume, a gap is developed between the fibers, which is causative of a defect such as insulation failure or swelling of the substrate. Thus, it is preferable that the base material ranges in volume proportion of 40% by volume or above and 70% by volume or below, and optimally 45% by volume or above and 55% by volume or below.

Moreover, according to the invention, the single fiber has, on its surface region, a groove formed along a longitudinal direction thereof, namely the axial direction thereof. From this feature, the following advantage accrues. An area of contact between the fiber and the resin portion is increased whereby they are firmly bonded to each other. This helps reduce the possibility of separation between the fiber and the resin portion.

Moreover, according to the invention, since the extent of undulation in the single fiber is kept small, it is possible to prevent the single fiber from extending in the longitudinal direction thereof. As a result, the expansion of the resin portion having a large linear expansion coefficient in the longitudinal direction of the single fiber can be suppressed successfully by the fabric cloth composed of the less-expandable single fibers. This makes it possible to achieve lowness of thermal expansion in the circuit board as a whole, and thereby reduce the difference in thermal expansion between the semiconductor element and the circuit board. Accordingly, it never occurs that a strain resulting from thermal expansion difference appears in the part of connection between the circuit board and the semiconductor element, wherefore connection reliability, namely product reliability can be maintained. In consequence, it is possible to realize a circuit board that has high-density circuit and is excellent in connection reliability and lamination reliability.

Moreover, according to the invention, the area of contact between the single fibers arranged in two different directions is larger than that in the conventional art, and the frictional resistance provided between the single fibers is greater than that in the conventional art, correspondingly. This makes it possible to minimize the positional deviation of the single fibers.

Moreover, according to the invention, since the extent of undulation in the single fiber is lower than that in the conventional art, even if the thickness of the resin portion is reduced, the fabric cloth can wholly be housed in the resin portion with stability. This makes it possible to prevent that the circuit conductor formed on the substrate is easily separated upon contact with the fabric cloth.

Moreover, according to the invention, by adjusting the linear expansion coefficient in the longitudinal direction of the single fiber to fall in a range of $-10$ ppm/° C. or above and 5 ppm/° C. or below, and adjusting the linear expansion coefficient of the resin material to fall in a range of 10 ppm/° C. or above and 60 ppm/° C. or below, it is possible to reduce the thermal expansion coefficient of the board as a whole to a level equal to that of the thermal expansion coefficient of the semiconductor element, for example.

BRIEF DESCRIPTION OF DRAWINGS

Other and further objects, features, and advantages of the invention will be more explicit from the following detailed description taken with reference to the drawings.

FIGS. 8A and 8B are sectional views of the circuit board (sectional views taken along the section line II-II of FIG. 10), with FIG. 8A showing a sectional view of a principal portion thereof and FIG. 8B showing an enlarged sectional view of the principal portion.

FIGS. 9A and 9B are sectional views of the circuit board (sectional views taken along the section line III-III of FIG. 10), with FIG. 9A showing a sectional view of a principal portion thereof and FIG. 9B showing an enlarged sectional view of the principal portion.

FIG. 17 is a perspective view showing each of sheets constituting the circuit board depicted in FIG. 16.

DESCRIPTION OF THE PREFERRED EMBODIMENTS

The applicant for the present application proposes a circuit board to which is applied, instead of a glass cloth, a fabric cloth formed by weaving organic fibers that are lower in thermal expansion coefficient than a glass cloth in two directions. The proposed circuit board comprises a substrate constituted by covering the fabric cloth with a resin portion made of a resin material such as epoxy resin; and a circuit conductor formed on the substrate. In this circuit board, the expansion of the resin portion having a relatively large linear expansion coefficient is suppressed by the provision of the fabric cloth having a small linear expansion coefficient. This makes it possible to achieve lowness of linear expansion coefficient in the board as a whole. However, it has been found that, if a significant undulation takes place in single fibers constituting the fabric cloth of the circuit board, the following problems may arise.

(1) Since the force exerted by the fabric cloth to suppress resin portion expansion is weakened, there is a tendency of the linear expansion coefficient of the circuit board in itself to become larger.

(2) Since an area of contact between single fibers crossing in two directions is decreased, the single fibers undergo positional deviation, for example. This leads to unevenness in arrangement distribution for the single fibers and fiber bundles.

(3) Part of the fabric cloth that has to be covered with the resin portion is inconveniently exposed from the resin portion, and the exposed part of the fabric cloth makes contact with the circuit conductor formed of a copper foil or the like. In consequence, the circuit conductor is prone to peel off at the location of contact with the part of the fabric cloth, which results in deterioration in circuit board productivity.

(4) In order to prevent the contact between the fabric cloth and the circuit conductor, it is necessary to take some measures, for example, making the resin portion for covering the fabric cloth thicker. In this case, however, the cubic volume of the resin portion is so large that it becomes difficult to achieve lowness of thermal expansion coefficient in the circuit board as a whole, and also there is a tendency of the rigidity/strength of the circuit board to decline.

Thus, to overcome the problems thus far described, the invention is devised. Hereinafter, embodiments to implement the invention will be described with reference to the drawings. Note that, since the drawings are outline drawings, the dimensional proportion of the drawings does not necessarily conform to the actual dimensional proportion.

In the present description, the term "substantially the same number" is equivalent to 80% or above and 100% or below of the number of other target single fibers. Moreover, in the present description, the term "substantially identical" refers also to "identical".

Figure 1:
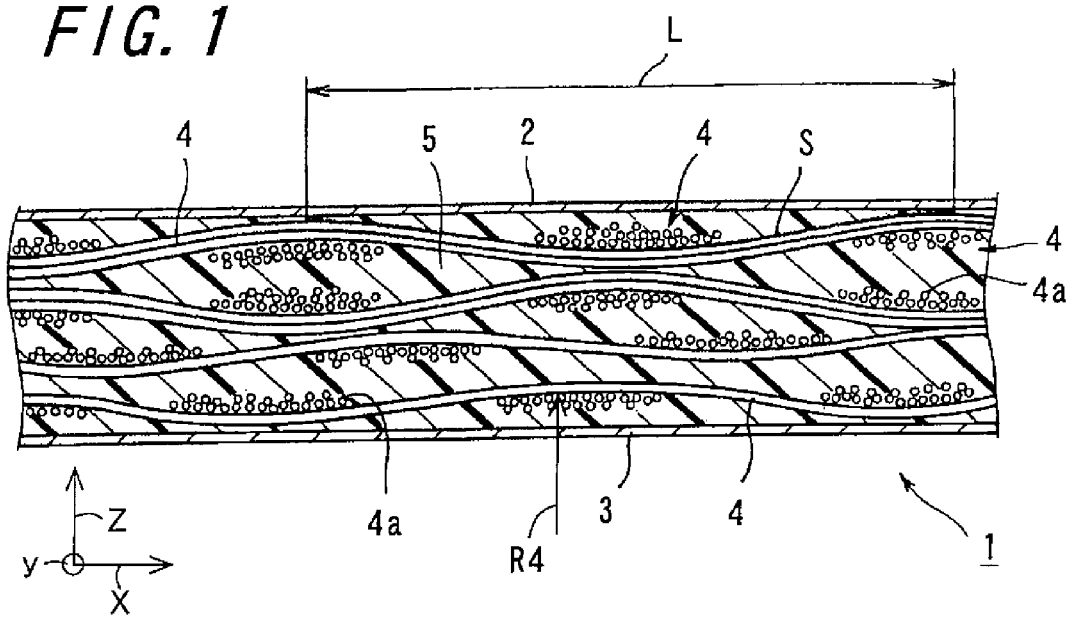
FIG. 1 is a sectional view of a principal portion of a circuit board in accordance with a first embodiment of the invention.
Figure 2:
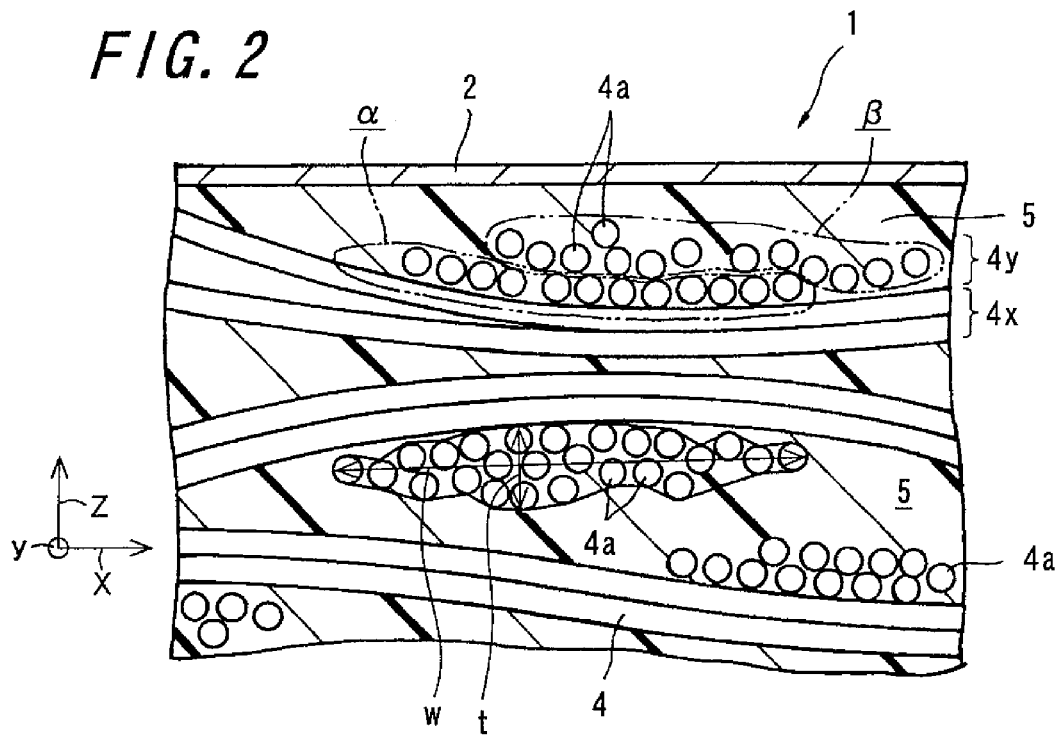
FIG. 2 is a sectional view showing a relationship between a fiber bundle in one direction and a fiber bundle in the other direction in an enlarged form (enlarged sectional view of the part depicted in FIG. 1).

FIG. 1 is a sectional view of a principal portion of a circuit board in accordance with a first embodiment of the invention. FIG. 2 is a sectional view showing a relationship between a fiber bundle 4y in one direction and a fiber bundle 4x in the other direction in an enlarged form (enlarged sectional view of the part depicted in FIG. 1). The circuit board 1 of the first embodiment (hereinafter also referred to as "the first circuit board") is used for electronic equipment such for example as various AV equipment, household electrical appliances, communications equipment, computer apparatuses, and peripheral equipment thereof. However, the applications of the circuit board 1 are not limited thereto. The following description deals also with an explanation about a method for manufacturing the first circuit board 1. The first circuit board 1 comprises an insulating substrate having circuit conductors 2, 3 serving as electrically conductive portions. The first circuit board 1 possesses a resin fabric cloth 4 used as a base material and a resin portion 5 for covering the resin fabric cloth 4.

At first, the resin fabric cloth 4 will be explained. The resin fabric cloth 4 is a woven cloth made of resin in which fiber bundles, each formed of a plurality of resin-made single fibers 4a, are arranged in two directions (first and second directions) so as to cross each other. The first and second directions are each a direction perpendicular to the direction of thickness of the first circuit board 1, but the second direction differs from the first direction. Herein, the first direction and the second direction are normal to each other, and the first direction is defined as x direction, and the second direction is defined as y direction. The thickness direction of the first circuit board 1 is defined as z direction. Moreover, since the single fibers 4a constituting the resin fabric cloth 4 are so disposed as to undulate in the z direction, it follows that the resin fabric cloth 4 has undulation as a whole. In a case where the degree of undulation of the resin fabric cloth 4 is represented by using a radius of curvature R4 as shown in FIG. 1, the smaller is the degree of undulation, the larger is the value of the radius of curvature R4.

In the resin fabric cloth 4, the linear expansion coefficient of the resin is specified as a linear expansion coefficient lower than that of silicon, which is a material used for a silicon chip to be mounted on the first circuit board 1. The single fiber 4a is so disposed as to undulate toward one side and the other side as seen in the z direction, and is formed in wavelike shape in conformity with a pitch at which the resin fabric cloth 4 is woven.

The larger is the undulation, the more likely it is that an effect of "spring" (referred to as "springy effect") is derived from the undulation. Therefore, the use of a fiber of low thermal expansion coefficient becomes less advantageous. A value indicative of the degree of the undulation (hereinafter referred to as "undulation value") is expressed as "S/L", namely a value obtained by dividing an actual length S of the single fiber corresponding to one period of a waveshape by a length L of one waveshape period. The undulation value S/L should preferably be greater than 1 time but smaller than or equal to 1.20 times. In a case where this value is "1", it is indicated that the fibers are free of undulation; that is, kept in a straight state. On the other hand, in a case where this value is less than "1", the extent of transformation of the fibers toward one side and the other side in the thickness direction of the fiber is so small that the thermal expansion coefficient of the circuit board can be kept low. However, there arises a problem that the resin is prone to peel off at the interface between the fibers stacked together.

In a case where the value is greater than "1" but smaller than or equal to "1.20", because of a small springy effect, it never occurs that the resin peels off at the interface, and the effect of achieving lowness of thermal expansion coefficient is sufficient. Optimally the value should fall in a range of 1.02 or above and 1.10 or below. The springy effect can be kept as small as possible in this optimal value range. This makes it possible to prevent occurrence of peeling-off of the resin at the interface without fail, and thereby enhance the thermal-expansion-coefficient lowering effect even further.

Figure 4:
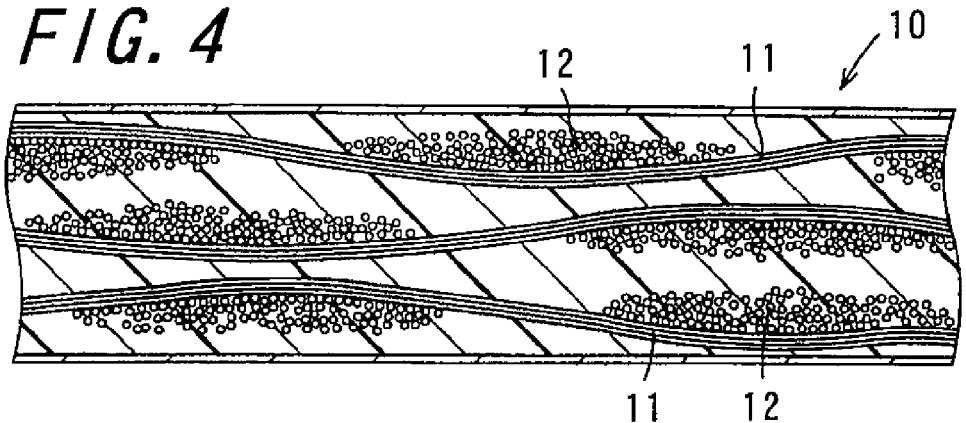
FIG. 4 is a sectional view of a principal portion of a circuit board of conventional design.
Figure 5:
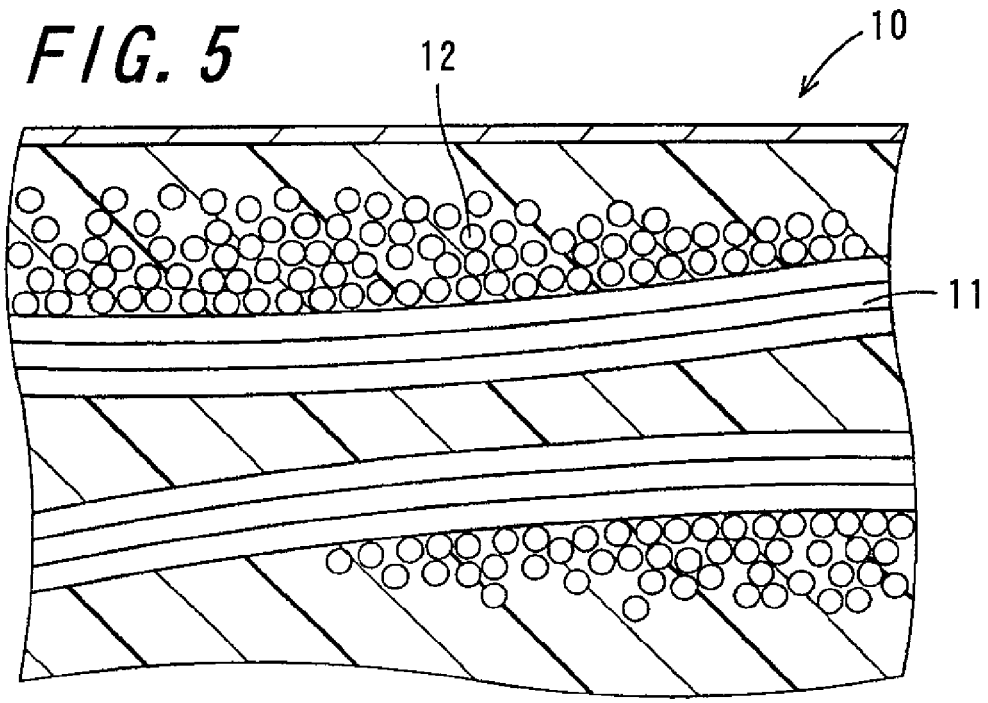
FIG. 5 is an enlarged sectional view showing a relationship between a fiber bundle in one direction and a fiber bundle in the other direction in the conventional circuit board.

In other words, the fiber bundle is formed in such a manner that the cross-sectional profile of the fiber bundle sectioned along a virtual plane perpendicular to its longitudinal direction takes on a horizontally long, flat shape (refer to FIG. 2). Herein, the "flat shape" means, as shown in FIG. 2, a shape that fulfills a condition of (w/t)≧10, where w represents the maximum width of the sectional profile of the fiber bundle and t represents the maximum thickness thereof. Moreover, the "sectional profile of the fiber bundle" means a shape defined by connecting tangential lines drawn with respect to the single fibers constituting the fiber bundle. Note that the maximum width w and the maximum thickness t are each an average value obtained on the basis of the result of measurement performed on the section of the fiber bundle sectioned along each of five virtual planes perpendicular to the longitudinal direction thereof. By imparting a horizontally long, flat-shaped cross-sectional profile to the fiber bundle in that way, it is possible to increase a contact portion between the single fibers 4a crossing in two directions, and thereby prevent, insofar as possible, the fibers from undergoing deformation in the vicinity of the fiber intersection point. In other words, it is possible to lessen the springy effect in the vicinity of the fiber intersection point. In contrast, in a case where the fiber bundle does not have a horizontally long, flat-shaped cross-sectional profile, the contact portion between the single fibers 4a in the vicinity of the fiber intersection point is so small that fiber deformation is observed in the vicinity of the fiber intersection point. In this regard, FIG. 4 is a sectional view of a principal portion of a circuit board 10 of conventional design. FIG. 5 is an enlarged sectional view showing a relationship between a one-directional fiber bundle 11 and the other-directional fiber bundle 12 in the circuit board 10 of conventional design. In this case, since the springy effect is observed in this region, even if a fiber having as low a thermal expansion as possible is used, it is difficult to obtain, in the board taken as a whole, a low thermal expansion coefficient which is substantially identical with that of a semiconductor element.

Figure 15:
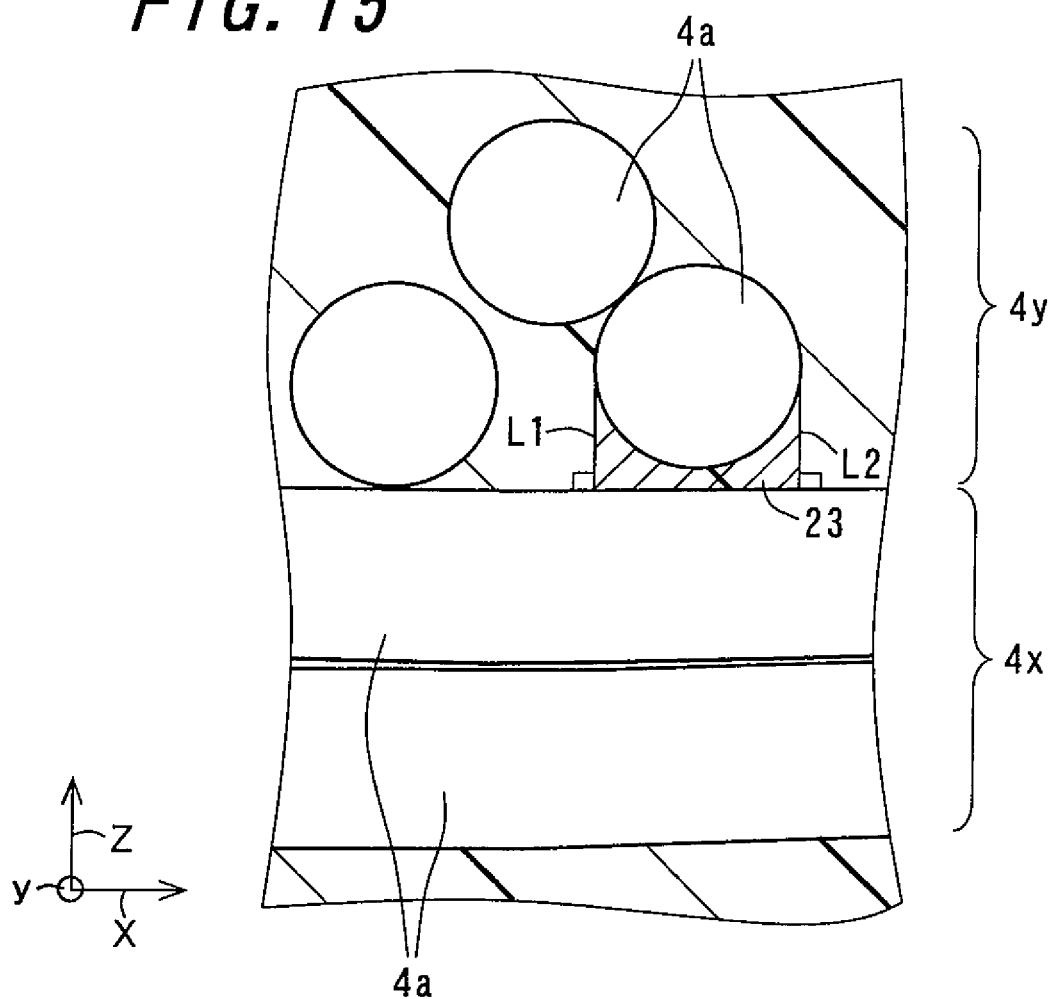
FIG. 15 is a sectional view for explaining proximate single fibers.

Further, in other words, out of the fiber bundles crossing in the x and y directions, the one-directional fiber bundle 4y is so designed that the number a of the single fibers 4a grouped together in the proximity to the other-directional fiber bundle 4x is substantially the same as, or larger than the number β of single fibers 4a other than the grouped single fibers. This makes it possible to increase the contact portion between the single fibers 4a crossing in two directions, and thereby prevent, insofar as possible, the fibers from undergoing deformation in the vicinity of the fiber intersection point. Accordingly, even if a change in temperature takes place, it never occurs that a strain resulting from thermal expansion difference appears in the part of connection between the board and the semiconductor element, wherefore connection reliability can be maintained. Herein, the "single fiber 4a located in the proximity to the other-directional fiber bundle 4x" refers, as shown in FIG. 15, to the single fiber 4a such that, under the condition that perpendicular lines that make contact with the single fiber 4a constituting the one-directional fiber bundle 4y and are dropped with respect to the other-directional fiber bundle 4x are defined as L1 and L2, respectively, a region 23 surrounded by the perpendicular lines L1 and L2, the single fiber 4a, and the other-directional fiber bundle 4x (diagonally shaded area in FIG. 15) is free of any other single fiber (this single fiber 4a is hereinafter also referred to as "proximate single fiber"). For example, out of the three single fibers 4a of the one-directional fiber bundle 4y shown in FIG. 15, the lower two of them are each the proximate single fiber, whereas the upper one is not the proximate single fiber. Moreover, the "number α of the single fibers 4a grouped together" refers to the average value of the numbers of the proximate single fibers as seen in the sections of the fiber bundle sectioned circumferentially in five different locations, respectively. On the other hand, the "number β of the single fibers 4a other than the grouped single fibers" refers to the average value of the numbers of the single fibers other than the proximate single fibers as seen in the same sections, respectively. In this way, by adjusting the number α of the proximate single fibers to be substantially the same as, or larger than the number β of the single fibers other than the proximate single fibers, it is possible to increase the contact portion between the single fibers 4a crossing in two directions, and thereby prevent, insofar as possible, the fibers from undergoing deformation in the vicinity of the fiber intersection point. Accordingly, even if a change in temperature takes place, it never occurs that a strain resulting from thermal expansion difference appears in the part of connection between the board and the semiconductor element, wherefore connection reliability can be maintained.

In contrast, in a case where the number of the proximate single fibers 4a is smaller than the number of the single fibers 4a other than the proximate single fibers, the contact portion between the single fibers 4a crossing in two directions is so small that fiber deformation is observed in the vicinity of the fiber intersection point. Therefore, since the springy effect is observed in this region, even if a fiber having as low a thermal expansion as possible is used, it is difficult to obtain, in the board taken as a whole, a low thermal expansion coefficient which is substantially identical with that of the semiconductor element.

In the first circuit board 1 is applicable a single fiber 4a having a Young's modulus of 10 GPa or above, the linear expansion coefficient of which in the longitudinal direction falls in a range of −10 ppm/° C. or above and 0 ppm/° C. or below (25° C. or above and 200° C. or below). As a fibrous material for constituting such a single fiber 4a, an organic fiber formed predominantly of wholly aromatic polyester, wholly aromatic polyamide, polyparaphenylene benzobisoxazole, or liquid crystal polymer is suitable for use. In a case where the fabric cloth is made of a material other than resin, it is possible to apply S glass, T glass as a material which has a Young's modulus of 10 GPa or above and exhibits a longitudinal linear expansion coefficient in a range of −10 ppm/° C. or above and 5 ppm/° C. or below (25° C. or above and 200° C. or below). Although E glass is also applicable, its linear expansion coefficient is larger than that of S glass, T glass, and thus the application of S glass, T glass is desirable. Note that, in this case, the Young's modulus, the linear expansion coefficient, the undulation value, and the volume ratio of the resin fabric cloth 4 to the substrate should preferably fall in a numerical range which is identical with the numerical range applicable to polyparaphenylene benzobisoxazole.

The lower the linear expansion coefficient in the longitudinal direction of the single fiber 4a, the better. This is because the effect of suppressing the expansion of the resin portion 5 can be enhanced. The linear expansion coefficient of 5 ppm/° C. or below can preferably be adopted. If the linear expansion coefficient exceeds 5 ppm/° C., the effect of keeping the thermal expansion coefficient of the board as a whole low becomes lessened. Accordingly, the linear expansion coefficient should preferably be smaller than or equal to 5 ppm/° C.

Moreover, the volume ratio of the resin fabric cloth 4 to the substrate is set to fall in a range of 40% by volume or above and 70% by volume or below. By doing so, it is possible to enhance the effect of keeping the thermal expansion coefficient of the board as a whole low. If the volume proportion of the resin fabric cloth 4 is less than 40% by volume, the force exerted by the resin fabric cloth 4 to suppress expansion of the resin portion in the x direction or the y direction is weakened, in consequence whereof there results a decrease in the effect of keeping the thermal expansion coefficient of the board as a whole low. On the other hand, if the volume proportion of the resin fabric cloth 4 exceeds 70% by volume, the cubic volume of the resin portion 5 becomes insufficient, wherefore it is difficult for a gap that appears between the single fibers 4a to be filled with the resin completely. This leads to development of a gap between the fibers 4a, which is causative of a defect such as insulation failure or swelling of the substrate. Thus, it is preferable that the resin fabric cloth 4 is in volume proportion of 40% by volume or above and 70% by volume or below, and optimally 45% by volume or above and 55% by volume.

Figure 3:
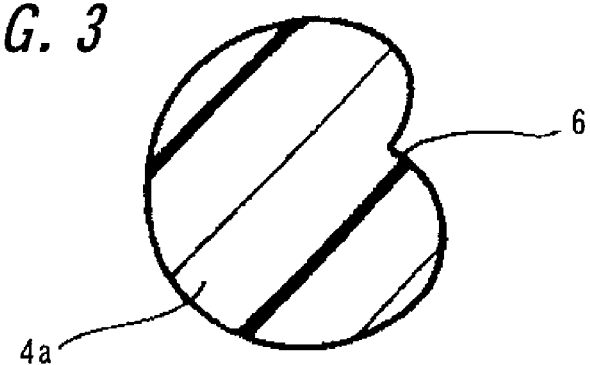
FIG. 3 is a sectional view showing a groove of a single fiber.

FIG. 3 is a sectional view showing a groove 6 of the single fiber 4a. The single fiber 4a has, on its surface region, the groove 6 formed along the longitudinal direction, namely the axial direction thereof. In this case, the following advantage can be gained. An area of contact between the single fiber 4a and the resin portion 5 is increased whereby they are firmly bonded to each other. This helps reduce the possibility of separation between the single fiber 4a and the resin portion 5.

Next, the resin portion 5 will be explained.

The resin portion 5 for covering the resin fabric cloth 4 is made of a resin material whose linear expansion coefficient is larger than that of a silicon chip: 3 ppm/° C. Specifically, the resin material having a linear expansion coefficient in a range of 10 ppm/° C. or above and 60 ppm/° C. or below (25° C. or above and 200° C. or below) is applicable as the resin portion 5.

In the resin portion 5, the smaller is its Young's modulus, the more likely it is that the expansion of the resin portion 5 can easily be suppressed by the single fiber 4a. Therefore, the Young's modulus should preferably be smaller than or equal to 5 GPa. Moreover, if the resin portion 5 has an unduly small Young's modulus, there is a tendency of the rigidity of the circuit board to become somewhat inadequate. Accordingly, it is preferable that the Young's modulus of the resin portion 5 is greater than or equal to 0.05 GPa.

The resin material is, for example, made of epoxy resin containing 20 wt % or above and 80 wt % or below of nonmetallic inorganic filler (spherical silica, for instance). With such a composition, it is possible to attain a linear expansion coefficient of 20 ppm/° C. or above and 60 ppm/° C. or below, as well as a Young's modulus of 2 GPa or above and 5 GPa or below. With the provision of the resin portion 5 made of such a resin material, the first circuit board 1 can be constituted.

While the above description deals with the case of using epoxy resin as the resin portion 5 material, the material for use is not limited to epoxy resin, as a matter of course. For example, a resin material such as cyanate resin or bismaleimide triazine can be applied as the resin portion 5 material. Note that, in this case, the Young's modulus and the linear expansion coefficient should preferably fall in a numerical range which is identical with the numerical range applicable to the epoxy resin. The amount of nonmetallic inorganic filler is changed properly in accordance with the kind of the resin material constituting the resin portion 5. Moreover, instead of silica, a material such as aluminum hydroxide, aluminum oxide, magnesium hydroxide, or calcium hydroxide may be used for the nonmetallic inorganic filler.

According to the first circuit board 1 thus far described, the resin fabric cloth 4, which is formed by arranging and weaving the single fibers 4a or the fiber bundles composed of a plurality of single fibers 4a whose linear expansion coefficient is smaller than that of silicon in two directions, is covered with the resin portion 5 made of a resin material whose linear expansion coefficient is larger than that of silicon. By virtue of this constitution, the following advantages can be gained.

It is possible to adjust the thermal expansion coefficient of the first circuit board 1 as a whole to be substantially identical with that of silicon. Accordingly, there is no difference in thermal expansion between the semiconductor element and the first circuit board 1. In this case, even if a change in temperature takes place due to variation of switching mode in the semiconductor element, it never occurs that a strain resulting from thermal expansion difference appears in the part of connection between the first circuit board 1 and the semiconductor element, wherefore connection reliability, namely product reliability can be maintained. Therefore, the first circuit board 1 is free from occurrence of a break that is a problem associated with the case of conducting flip-chip mounting of a semiconductor chip employing a low-dielectric-constant insulating material. This makes it possible to take full advantage of the performance capability of the semiconductor element. It is thus possible to realize a circuit board that has high-density circuit and is excellent in connection reliability and lamination reliability.

The reason for using the single fiber 4a which is lower in linear expansion coefficient than silicon is as follows. A copper circuit portion which is inevitably included in the first circuit board 1 exhibits a thermal expansion coefficient of 16 ppm/° C. Even in a case where the first circuit board 1 includes the copper circuit portion, by virtue of such a single fiber, the thermal expansion coefficient of the first circuit board 1 in itself can be kept substantially identical with that of silicon. When a silicon chip is mounted on such a first circuit board 1, it never occurs that a strain resulting from thermal expansion difference appears in the part of connection between them, wherefore connection reliability can be maintained.

With the provision of the single fiber 4a having a Young's modulus of 10 GPa or above and the resin material having a Young's modulus of 0.05 GPa or above, the first circuit board 1 can be implemented. A point of importance in the first circuit board 1 is that the Young's modulus of the single fiber 4a is larger than or equal to 10 GPa. Since the copper circuit portion which is inevitably included in the first circuit board 1 exhibits a thermal expansion coefficient of 16 ppm/° C., in order to keep low the thermal expansion coefficient of the entire constitution in a state of including the copper circuit, it is preferable that the Young's modulus of the fiber is larger than or equal to 65 GPa. The higher the fiber's Young's modulus, the better. However, a fiber having a high Young's modulus tends to incur poor adhesivity with respect to insulating resin. In view of this, a fiber having a Young's modulus of approximately 200 GPa or above and 270 GPa or below is suitable for use.

Moreover, if the Young's modulus of the resin is less than 0.05 Gpa, its fiber retention force is so weak that the fibers are moved in various directions. This gives rise to a problem of an undesirable increase in the degree of deformation in the substrate. In a case where the resin is high both in Young's modulus and in thermal expansion coefficient, there is a problem that the effect of achieving lowness of thermal expansion in the board as a whole brought about by the low-thermal-expansion-coefficient fiber becomes lessened. In a case where the resin has a high Young's modulus and a thermal expansion coefficient of 10 ppm/° C. or below, it is possible to keep low the thermal expansion coefficient of the board as a whole on a simulation basis. However, to date a resin material having such characteristics has not been commercially available.

Young's modulus of the single fiber 4a and the resin portion 5 can be measured by the following methods.

As to the resin portion 5, a film formed through a curing process under the same conditions as those adopted for the production of the first circuit board 1 is cut into a rectangular test piece. This test piece is tested using a tensile tester. The Young's modulus of the resin portion 5 can be measured by dividing a tensile stress per unit cross-sectional area obtained through the testing by the amount of expansion of the resin. As to the single fiber 4a, a bundle of the fibers is tested using a tensile tester. The Young's modulus of the single fiber 4a can be measured by dividing a tensile stress per unit cross-sectional area obtained through the testing by the amount of expansion of the fiber.

Alternatively, it is possible to measure the Young's modulus with the first circuit board 1 in finished form. As to the resin portion 5, the resin portion 5 is cut into a lamella piece, and an indenter such as a quadrangular prism or a trigonal pyramid is pressed into the surface of the lamella piece. The Young's modulus of the resin portion 5 is determined on the basis of the load applied to the indenter at this time and the projected area underneath the indenter. As to the single fiber 4a, the resin portion 5 is removed to take a fiber bundle out. The fiber bundle is tested using a tensile tester. The Young's modulus of the single fiber 4a can be measured by dividing a tensile stress per unit cross-sectional area obtained through the testing by the amount of expansion of the fiber. In another alternative, the Young's modulus of the resin portion 5, now cut into a lamella piece as described above, is measured in advance. Then, Young's modulus of a composite body composed of the resin portion 5 and the single fiber 4a is measured. On the basis of the Young's modulus of this composite body and the Young's modulus of the resin portion 5 alone, the Young's modulus of the single fiber 4a can be measured by running a simulation.

By adjusting the linear expansion coefficient in longitudinal (axial) direction of the single fiber 4a to fall in a range of −10 ppm/° C. or above and 0 ppm/° C. or below, as well as adjusting the linear expansion coefficient of the resin material to fall in a range of 10 ppm/° C. or above and 60 ppm/° C. or below, and also fulfilling other predetermined conditions, it is possible to reduce the thermal expansion coefficient of the first circuit board 1 as a whole to a level equal to that of the thermal expansion coefficient of the semiconductor element. The lower the axial linear expansion coefficient of the single fiber 4a, the better. The linear expansion coefficient is suitable for use so long as it is lower than or equal to 0 ppm/° C. If the linear expansion coefficient exceeds 0 ppm/° C., the effect of keeping the thermal expansion coefficient of the first circuit board 1 as a whole low is nullified. Moreover, the lower the linear expansion coefficient of the resin portion 5, the better. However, since a resin material having a linear expansion coefficient of 10 ppm/° C. or below is commercially unavailable, no testing has been carried out so far. The resin portion 5 having a linear expansion coefficient of 10 ppm/° C. or above and 60 ppm/° C. or below is suitable for use. If the linear expansion coefficient exceeds 60 ppm/° C., it becomes impossible to make the thermal expansion coefficient of the first circuit board 1 as a whole equivalent to that of silicon.

The linear expansion coefficient in the longitudinal direction of the single fiber 4a can be measured in the following method, and also the linear expansion coefficient of the resin portion 5 can be measured in the following method.

As to the resin portion 5, for example, a test piece having a dimension of 2 mm×3 mm×15 mm is obtained by cutting. This test piece is subjected to temperature rise while being kept in contact with a size measurement probe. The linear expansion coefficient of the resin portion 5 can be measured by determining dimensional variation caused by temperature changes. As to the single fiber 4a, a bundle of the fibers is attached to a size measurement probe. The fiber bundle is subjected to temperature rise while applying a load in a direction in which the fiber bundle is pulled. The linear expansion coefficient of the single fiber 4a can be measured by determining dimensional variation caused by temperature changes.

Alternatively, it is possible to measure the linear expansion coefficient of the single fiber 4a and that of the resin portion 5 with the first circuit board 1 in finished form. As to the resin portion 5, the resin portion 5 is cut into a lamella piece of adequate size, and this lamella piece serving as a test piece is attached to a size measurement probe. Then, the test piece is subjected to temperature rise while applying a load in a direction in which the test piece is pulled. The linear expansion coefficient of the resin portion 5 can be measured by determining dimensional variation caused by temperature changes. As to the single fiber 4a, the resin portion 5a is removed to take a fiber bundle out, and this fiber bundle is attached to a size measurement probe. Then, the fiber bundle is subjected to temperature rise while applying a load in a direction in which the fiber bundle is pulled. The linear expansion coefficient of the single fiber 4a can be measured by determining dimensional variation caused by temperature changes. In another alternative, the thermal expansion coefficient of the resin portion 5, now cut into a lamella piece as described above, is measured in advance. Then, thermal-expansion-coefficient of a composite body composed of the resin portion 5 and the single fiber 4a is measured. On the basis of the thermal expansion coefficient of this composite body and the thermal expansion coefficient of the resin portion 5 alone, the thermal expansion coefficient of the single fiber 4a can also be measured by running a simulation.

Figure 6:
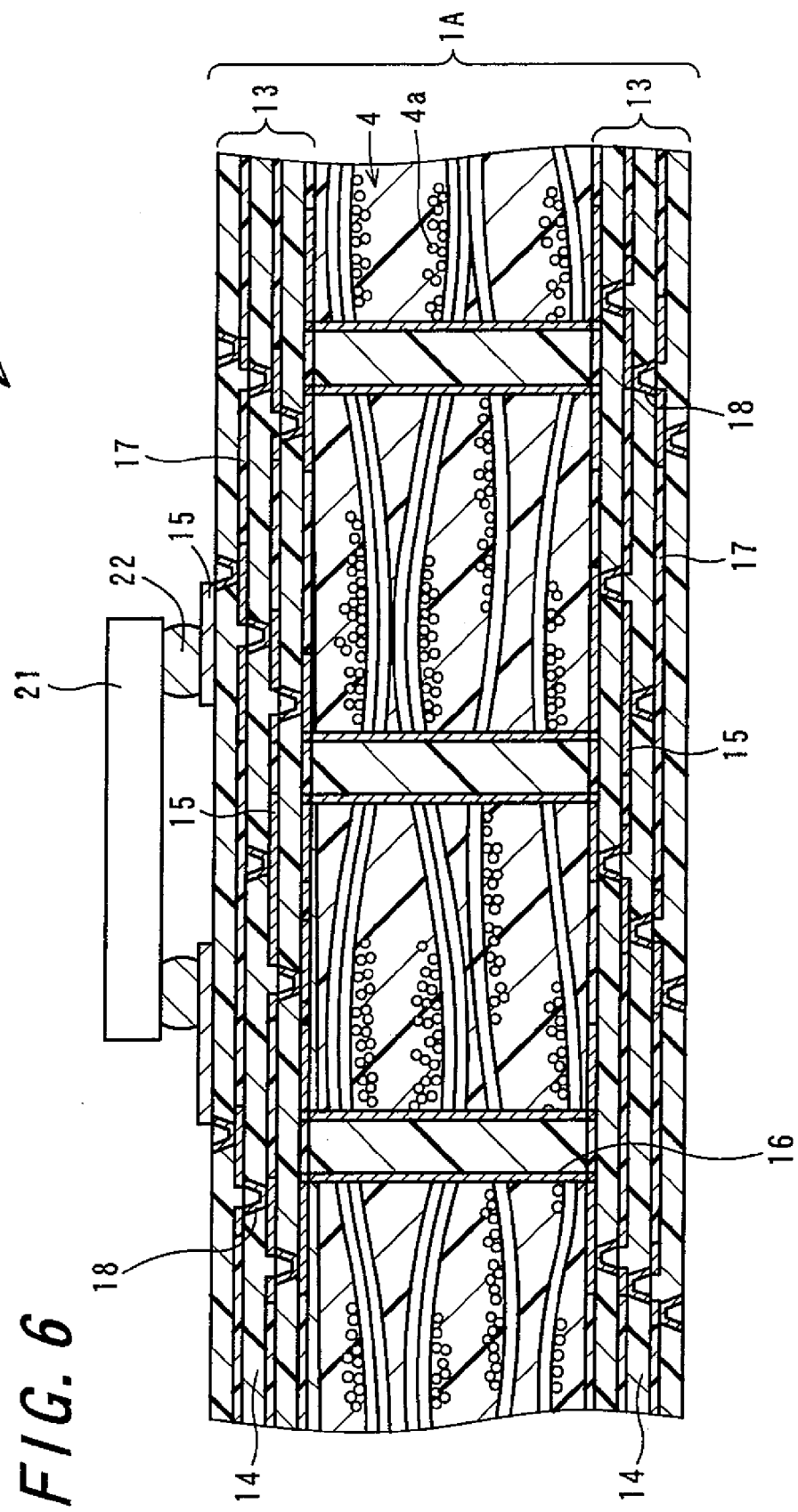
FIG. 6 is a sectional view of a principal portion of a mounting, structure in accordance with a second embodiment of the invention.

FIG. 6 is a sectional view of a mounting structure 20 in accordance with a second embodiment of the invention. The mounting structure 20 shown in FIG. 6 comprises a circuit board 1A and a semiconductor element 21 which is mounted on the circuit board 1A. The circuit board 1A is constituted by forming, on each of the main surfaces of the first circuit board 1 thus far described, a circuit layer 13 formed by stacking insulating layers 14 and circuit layers 15 in an alternating manner. The semiconductor element 21 is flip-chip mounted on the circuit board 1A via, for example, the circuit layer 15 and a bump formed on the main surface of the circuit board 1A.

The insulating layer 14 is formed of a resin film whose thickness dimension is so determined as to fall in a range of approximately 12 μm or above and 50 μm or below. In order to reduce the thermal expansion coefficient of the board as a whole to a level equal to that of the thermal expansion coefficient of the semiconductor element 21, it is preferable that the resin film has a Young's modulus of 10 GPa or above and a linear expansion coefficient of 3 ppm/° C. or below. As a material for forming the resin film, polyparaphenylene benzobisoxazole, polyimide benzoxazole, wholly aromatic polyimide, wholly aromatic polyester, and liquid crystal polymer can be used. The resin film contains a filler for the purposes of thermal-expansion-coefficient adjustment and mechanical strength enhancement. As a ceramic material for use as an inorganic filler, silica (silicon dioxide), aluminum oxide, and the like substance can be used. In general, the filler has a substantially spherical particle configuration, a needle-like particle configuration, or a flake-like particle configuration, for example. From the filling property standpoint, it is desirable to impart a substantially spherical particle configuration to the filler.

On the other hand, the circuit layer 15 is formed by means of plating with use of a metal material such as copper. For example, the thickness of the circuit layer 15 is set to range between 3 μm and 18 μm. The circuit layers 15 is connected to each other by a via-conductor 18 disposed in the insulating layer 14. Just as is the case with the circuit layer 15, the via-conductor 18 is formed by means of copper plating or otherwise.

An adhesive 17 is interposed between the insulating layer 14 and the circuit layer 15, or between the insulating layers 14. The adhesive 17 is formed predominantly of one of acrylic resin, epoxy resin, urethane resin, and silicone resin. The insulating layer 14 and the circuit layer 15, or the insulating layers, are bonded to each other by the adhesive 17. A combination of a material used for the insulating layer 14 and a material used for the adhesive 17 is selected in such a manner that good adhesiveness can be ensured between the insulating layer 14 and the adhesive 17 and that high heat resistance can be attained. This makes it possible to provide satisfactory heat resistance at the time of mounting the circuit board 1A on another external substrate with use of solder or the like material. Moreover, the material combination of the insulating layer 14 and the adhesive 17 is selected in such a manner that there is a little difference in thermal expansion coefficient between the insulating layer 14 and the adhesive 17. This makes it possible to decrease the stress resulting from the thermal expansion coefficient difference, and thereby prevent occurrence of peeling-off at the interface between the circuit layer 15 and the insulating layer 14. Moreover, it is possible to decrease the degree of warpage occurring in the circuit board 1A as a whole, wherefore the circuit board 1A can be adapted to the semiconductor element 21 having an increasingly narrower terminal pitch, which is mounted on the surface of the circuit board 1A.

Note that the circuit layer 15 in the circuit layer 13 located on one main surface of the insulating substrate and the circuit layer 15 in the circuit layer 13 located on the other main surface of the insulating substrate are electrically connected to each other via a through-hole conductor 16 disposed on the inner wall surface of a through-hole formed so as to penetrate through the insulating substrate in the direction of thickness thereof.

The mounting structure 20 comprises the circuit board 1A and the semiconductor element 21 which is mounted on the circuit board 1A. The semiconductor element 21, which is a chip component made of silicon, is mounted via a bump 22 made of an electrically conductive material such as solder or gold formed on one main surface of the circuit board 1A. The semiconductor element 21 is provided with a function to control a predetermined electric signal or a function to store predetermined information. For example, the semiconductor element 21 is formed of a low-dielectric-constant material (Low-k material) such as diamond-like carbon. Although the use of such a Low-k material allows high-speed signal processing operation, the semiconductor element 21 made of the Low-k material is low in strength. Therefore, in a case where such a semiconductor element 21 is mounted on the conventional circuit board, inconveniently, the semiconductor element tends to suffer from breakage due to thermal-expansion-coefficient mismatch between the semiconductor element and the circuit board. In contrast, in a case where the semiconductor element 21 is mounted on the circuit board embodying the invention, the difference in thermal expansion coefficient between the semiconductor element 21 and the circuit board 1A is so small that the stress induced by the thermal expansion coefficient difference can be decreased. As a result, the semiconductor element 21 can be protected from breakage.

Next, a modified example of the circuit board 1A in accordance with the first embodiment of the invention will be described with reference to FIGS. 16 and 17.

Figure 16:
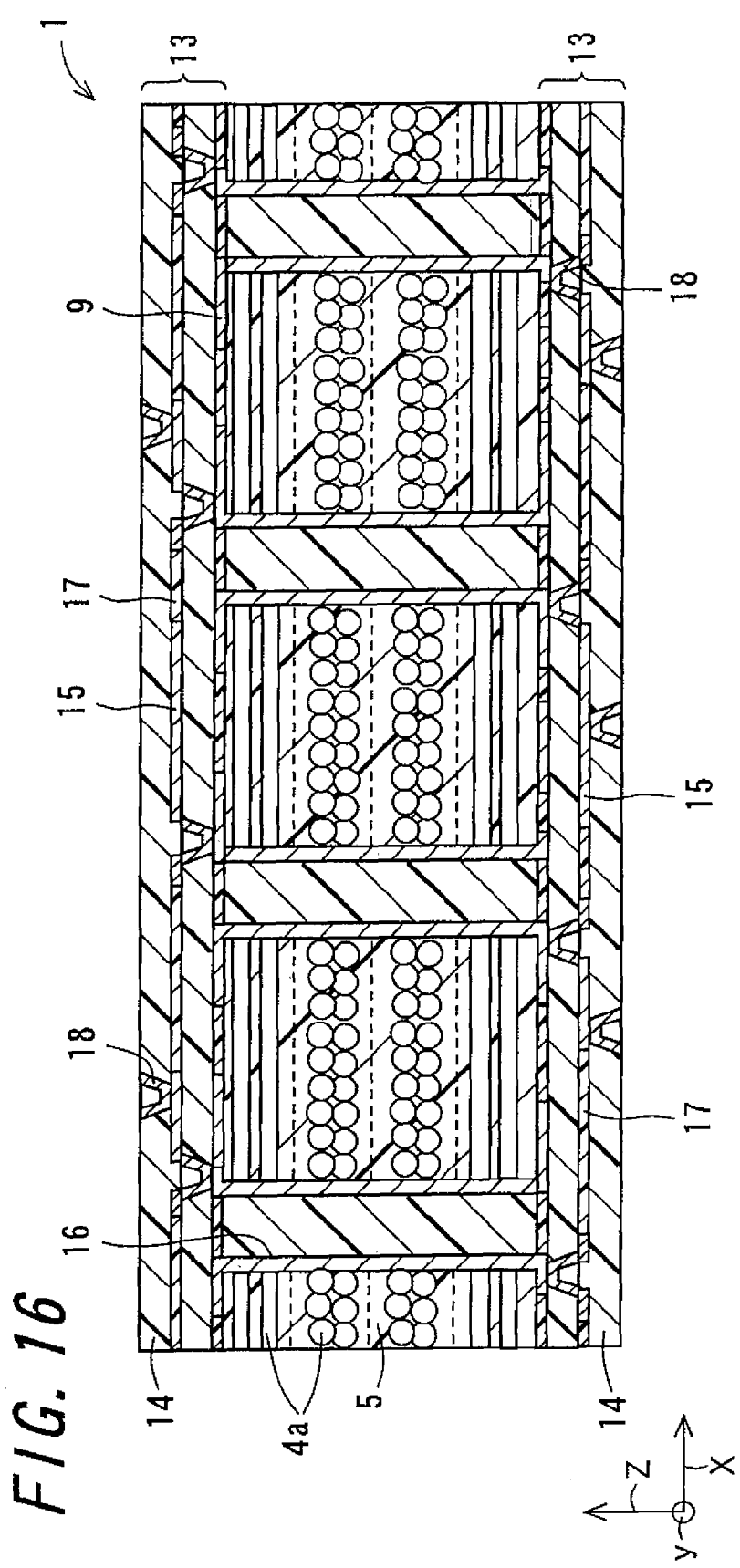
FIG. 16 is a modified example of the circuit board according to the first embodiment of the invention.

FIG. 16 is a sectional view showing the modified example of the circuit board 1A according to the first embodiment. FIG. 17 is a perspective view showing each of sheets constituting the circuit board 1A. In the circuit board 1A of the modified example is employed, as a base material, arrangement of a plurality of arrays, of which each includes a plurality of fiber bundles. In the circuit board 1A composed of such a base material formed by aligning fiber bundles in one direction, in general, no springy effect arises. This makes it possible to keep the linear expansion coefficient in the longitudinal direction of the fiber extremely small. On the other hand, the linear expansion coefficient of the fiber in a direction perpendicular to its longitudinal direction is not so small. Thus, as shown in FIG. 16, in the circuit board 1A of this embodiment, a plurality of resin sheets 51, 52, 53, and 54 are stacked one upon another, with their fiber orientations made different from one another. The resin sheets are each formed of the resin portion 5 for covering the fibers aligned in one direction. To be more specific, given the longitudinal direction of the fiber of the uppermost resin sheet 51 of 0°, then, starting from the top sheet to the bottom sheet, the fiber's longitudinal directions of the resin sheets are defined by 0°, 90°, 90°, and 0°, respectively. By stacking these resin sheets in this manner, the circuit board 1B is constituted. With such a stacking pattern, it is possible to achieve lowness of thermal expansion while uniformizing the linear expansion coefficients in the circuit board 1A as a whole. Note that the definitions of the fiber's longitudinal directions are not limited to those suggested hereinabove, and therefore, for example, they can be defined by 0°, 60°, 120°, and 0°, respectively.

Next, a method for manufacturing the circuit board 1A will be explained with reference also to Tables 1 and 2.

As the fabric cloths 4, there were prepared woven cloths composed of resin fibers of three types and glass fibers of three types, respectively, with varying thread thicknesses and weaving pitches. Moreover, in regard to the fibers of wholly aromatic polyamide and polyparaphenylene benzobisoxazole, sheets formed by aligning the fibers in one direction were also prepared for use.

Insulating resin was prepared for use as a resin material for forming the resin portion 5. As the resin material, three kinds of resins were used: epoxy-based resin; cyanate-based resin; and bismaleimide triazine-based resin. Such a resin and a curing agent were dissolved in a solvent such as methyl ethyl ketone, and these ingredients were mixed together thoroughly until no solid matter remains undissolved. Next, a predetermined resin was mixed with silane coupling-treated powdery spherical silica. The mixing of silane coupling-treated spherical silica was conducted with the addition of a solvent of the same type as the solvent in which the resin was dissolved in advance thereby to achieve particle deflocculation. Subsequently, the resin and the silica powder were mixed together in a state of being dissolved in the solvent, and were then filtered by a nylon-made filter to remove undissolved resin portions and coarse aggregated silica particles. Next, the admixture was dried while being mixed, whereupon a varnish having predetermined concentration and viscosity was formed.

Next, the fabric cloth and the sheet formed by aligning fibers in one direction were impregnated with the varnish thus formed. Following the completion of impregnation, an excess of the varnish was removed by a squeezing roller so as to adjust the amount of resin adherent to the fiber. The sheet was dried by a drying machine to form a prepreg. A predetermined number of prepregs were stacked together, and a 8 μm-thick copper foil was laminated on each of the upper and back surfaces of the stacked body. Then, hot pressing was performed thereon under the conditions of 200° C., 60 minutes, and a pressure of 3.5 MPa in a vacuum pressing apparatus. In this way, a substrate having a copper foil on both surfaces was fabricated.

Next, hole drilling and a core substrate circuit will be explained.

Following the formation of the substrate, both surfaces of the substrate were subjected to cleaning to remove foreign matters such as resin adherent to the surfaces. After that, a through-hole processing was performed by using a laser apparatus. After the processing, cleaning was conducted once again to clean the hole, and, by means of electroless plating and electrolytic plating, the formation of the through-hole conductor 16 was completed. Moreover, with application of a photosensitive resist, exposure and development process for a desired circuit was conducted, and, by means of etching, the copper circuit layer 15 was formed. Lastly, the resist was removed, whereupon a core substrate was constituted in which a single circuit layer 15 was formed on a per-surface basis.

A build-up process will be explained hereinafter.

There was also fabricated the circuit board 1A by forming, on each of the upper and back surfaces of the core substrate, the circuit layer 13 formed by stacking the insulating layers 14 and the circuit layers 15 in an alternating manner by the build-up method. The build-up process was conducted by using the semi-additive technique. That is, an epoxy-based insulating material was applied to the core substrate, and a via-hole was created by laser processing. After electroless plating was performed on the front face thereof, with a photosensitive resist applied to the surface, circuit exposure and development process was conducted. By the passage of electric current through the resultant electroless plated layer, electroplating was effected to form a circuit. After that, the resist was peeled off and the electroless copper plated layer was removed by means of etching, whereupon the circuit layer 15 was formed. By repeating the processing operations a predetermined number of times, the circuit board 1A as shown in FIG. 6 was produced on which three pieces of the circuit layers 13 were formed on a per-surface basis.

In the case of conducting the build-up process, the board thickness falls in a range of, for example, 400 μm or above and 500 μm or below. Moreover, the thickness of the copper circuit of the circuit layer 15 falls in a range of, for example, 10 μm or above and 12 μm or below, and the linear expansion coefficient thereof stands, for example, at 16 ppm/° C. The insulating layer 14 has a thickness of, for example, 20 μm, and has a thermal expansion coefficient of, for example, 3 ppm/° C.

A board evaluation method will be explained hereinafter.

Table 1 is a table showing data (Young's modulus, and so forth) on the circuit boards numbered serially "1" to "17" on an individual basis.

TABLE 1

| No. | Fibrous material Material | GPa Young's modulus | ppm/° C. Linear expansion coefficient | S/L | vol. % Volume proportion | Resin material Material | GPa Young's modulus | ppm/° C. Linear expansion coefficient | wt % Silica content | Remarks |
|---|---|---|---|---|---|---|---|---|---|---|
| 1 | Wholly aromatic polyamide | 110 | −5 | 1.3 | 45 | Epoxy resin | 4 | 60 | 20 | α:β = 1:4 |
| 2 | ↑ | ↑ | ↑ | 1.2 | ↑ | ↑ | ↑ | ↑ | ↑ | |
| 3 | ↑ | ↑ | ↑ | 1.1 | ↑ | ↑ | ↑ | ↑ | ↑ | α:β = 1:0.9 |
| 4 | ↑ | ↑ | ↑ | 1.05 | ↑ | ↑ | ↑ | ↑ | ↑ | α:β = 1:0.7 |
| 5 | ↑ | ↑ | ↑ | 1.02 | 80 | ↑ | ↑ | ↑ | ↑ | Void |
| 6 | ↑ | ↑ | ↑ | 1.02 | 70 | ↑ | ↑ | ↑ | ↑ | |
| 7 | ↑ | ↑ | ↑ | 1.02 | 60 | ↑ | ↑ | ↑ | ↑ | |
| 8 | ↑ | ↑ | ↑ | 1.02 | 50 | ↑ | ↑ | ↑ | ↑ | |
| 9 | ↑ | ↑ | ↑ | 1.02 | 40 | ↑ | ↑ | ↑ | ↑ | |
| 10 | ↑ | ↑ | ↑ | 1.1 | 30 | ↑ | ↑ | ↑ | ↑ | |
| 11 | ↑ | ↑ | ↑ | 1.1 | 45 | ↑ | 0.02 | 100 | 0 | |
| 12 | ↑ | ↑ | ↑ | ↑ | ↑ | ↑ | 0.05 | 100 | 0 | |
| 13 | ↑ | ↑ | ↑ | ↑ | ↑ | ↑ | 2 | 85 | 0 | |
| 14 | ↑ | ↑ | ↑ | ↑ | ↑ | ↑ | 6 | 40 | 40 | |
| 15 | Wholly aromatic polyester | 65 | 0 | 1.05 | 50 | ↑ | ↑ | ↑ | ↑ | |
| 16 | ↑ | 70 | −5 | ↑ | ↑ | ↑ | ↑ | ↑ | ↑ | |
| 17 | ↑ | 75 | −10 | ↑ | ↑ | ↑ | ↑ | ↑ | ↑ | |

Table 2 is a table showing data (Young's modulus, and so forth) on the circuit boards numbered serially "18" to "34" on an individual basis. In Table 2, "S glass", "T glass", and "E glass" are equivalent to a glass material that has a $SiO_2$ content of 50% by weight or above to 70% by weight or below, and also contains $Al_2O_3$ as the remainder, and in addition, as impurities, MgO, CaO, $B_2O_3$, $Na_2O$, $K_2O$, and $ZrO_2$ in small amounts are contained therein.

TABLE 2

| No. | Fibrous material Material | GPa Young's modulus | ppm/° C. Linear expansion coefficient | S/L | vol. % Volume proportion | Resin material Material | GPa Young's modulus | ppm/° C. Linear expansion coefficient | wt % Silica content | Remarks |
|---|---|---|---|---|---|---|---|---|---|---|
| 18 | Polybenzoxazole | 270 | −7 | 1.1 | 45 | Epoxy resin | 4 | 60 | 20 | |
| 19 | ↑ | ↑ | ↑ | 1.02 | ↑ | Cyanate resin | 3 | 20 | 55 | |
| 20 | ↑ | ↑ | ↑ | ↑ | 60 | ↑ | ↑ | ↑ | ↑ | |
| 21 | ↑ | ↑ | ↑ | ↑ | 70 | ↑ | ↑ | ↑ | ↑ | |
| 22 | ↑ | ↑ | ↑ | ↑ | 80 | ↑ | ↑ | ↑ | ↑ | Void |
| 23 | ↑ | 200 | −6 | 1.05 | 50 | Cyanate resin | 3 | 20 | 55 | |
| 24 | ↑ | ↑ | ↑ | ↑ | ↑ | ↑ | 5 | 15 | 70 | |
| 25 | ↑ | ↑ | ↑ | ↑ | ↑ | ↑ | 7 | 12 | 80 | |
| 26 | ↑ | ↑ | ↑ | ↑ | ↑ | ↑ | 3 | 10 | 90 | Void |
| 27 | ↑ | ↑ | ↑ | ↑ | ↑ | Bismaleimide triazine | 3 | 60 | 0 | |
| 28 | ↑ | ↑ | ↑ | 1.25 | 40 | Cyanate resin | 3 | 20 | 55 | α:β = 1:3 |
| 29 | ↑ | ↑ | ↑ | 1.15 | 43 | ↑ | ↑ | ↑ | ↑ | |
| 30 | ↑ | ↑ | ↑ | 1.08 | 48 | ↑ | ↑ | ↑ | ↑ | α:β = 1:1 |
| 31 | ↑ | ↑ | ↑ | 1.02 | 50 | ↑ | ↑ | ↑ | ↑ | α:β = 1:0.6 |
| 32 | S glass | 90 | 3 | 1.05 | 45 | Epoxy resin | 4 | 60 | 20 | Out of range |
| 33 | T glass | 90 | 3 | 1.05 | 45 | ↑ | ↑ | ↑ | ↑ | Out of range |
| 34 | E glass | 75 | 5.5 | 1.05 | 45 | ↑ | ↑ | ↑ | ↑ | Out of range |

Table 3 is a table showing the results of tests conducted on the circuit boards numbered "1" to "17".

TABLE 3

| No. | ppm/° C. Linear expansion coefficient of board material | ppm/° C. Linear expansion coefficient of board having single layer of circuit on per-surface basis | ppm/° C. Linear expansion coefficient of board having two layers of circuit on per-surface basis | Heat resistance test Solder float | Presence/absence of breakage after chip mounting | Remarks |
|---|---|---|---|---|---|---|
| 1 | 6 | 8 | 10 | Good | Poor | |
| 2 | 3 | 4 | 7 | Good | Good | |
| 3 | 2.5 | 4 | 6 | Good | Good | |
| 4 | 2 | 4 | 6 | Good | Good | |
| 5 | −4 | −2 | 0 | Poor | Good | |
| 6 | −3 | −1 | 1 | Good | Good | |
| 7 | −3 | −1 | 1 | Good | Good | |
| 8 | −2 | 0 | 2 | Good | Good | |
| 9 | −1 | 1 | 3 | Good | Good | |
| 10 | 6 | 8 | 10 | Good | Poor | |
| 11 | 5 | 7 | 9 | Good | Poor | |
| 12 | 2 | 4 | 6 | Good | Good | Board deformation |
| 13 | 2 | 4 | 6 | Good | Good | Board deformation |
| 14 | 2 | 4 | 6 | Good | Good | |
| 15 | 3 | 7 | 9 | Good | Poor | |
| 16 | 0 | 4 | 6 | Good | Good | |
| 17 | −1 | 2 | 4 | Good | Good | |

Table 4 is a table showing the results of tests conducted on the circuit boards numbered "18" to "34".

TABLE 4

| No. | ppm/° C Linear expansion coefficient of board material | ppm/° C. Linear expansion coefficient of board having two layers of circuit on per-surface basis | ppm/° C. Linear expansion coefficient of board having three layers of circuit on per-surface basis | Heat resistance test Solder float | Presence/absence of breakage after chip mounting | Remarks |
|---|---|---|---|---|---|---|
| 18 | −4 | 0 | 3 | Good | Good | |
| 19 | −5 | −1 | 2 | Good | Good | |
| 20 | −5 | −1 | 2 | Good | Good | |
| 21 | −6 | −2 | 1 | Good | Good | |
| 22 | −7 | −3 | 0 | Poor | Good | |
| 23 | −2 | 2 | 4 | Good | Good | |
| 24 | −2 | 2 | 4 | Good | Good | |
| 25 | −2 | 2 | 4 | Good | Good | |
| 26 | −2 | 2 | 4 | Poor | Good | |
| 27 | −2 | 2 | 4 | Good | Good | |
| 28 | 5 | 9 | 12 | Good | Poor | |
| 29 | 2 | 6 | 8 | Good | Good | |
| 30 | −1 | 4 | 6 | Good | Good | |
| 31 | −3 | 1 | 2 | Good | Good | |
| 32 | 5 | 10 | 13 | Good | Poor | |
| 33 | 6 | 11 | 14 | Good | Poor | |
| 34 | 16 | 16 | 16 | Good | Poor | |

In the following explanation, reference is made also to Tables 3 and 4. With respect to the fabricated board, measurement was made of, as a basic characteristic, thermal expansion coefficient. Moreover, in order to check the presence or absence of internal defects such as bubbles, a solder float test was conducted. Further, a silicon chip was flip-chip mounted on the board to check the presence or absence of chip breakage subsequent to the mounting.

Thermal expansion coefficient measurement will be explained hereinafter.

Thermal expansion coefficient measurement was performed on the fabricated core substrate. A test sample for use in thermal expansion coefficient measurement was obtained from each of the copper foil-free substrate and the circuit-bearing substrate by cutting. Similarly, thermal expansion coefficient measurement was performed also on the substrate on which are formed two/three layers of circuit on a per-surface basis through the build-up process by using a test sample obtained therefrom by cutting.

The solder float test will be explained hereinafter.

Solder floating is a test to float a test sample in a bath of solder in a heated state. In a case where a defect such as a bubble is present in the test sample interiorly thereof, since development of delamination or blistering begins at the position of the defect, it is possible to recognize the defect. Specifically, the formed test sample was floated in a bath of solder heated at 280° C., and the presence or absence of sample blistering was checked. The sample in which was observed a change of color resulting from delamination or blistering was judged to be defective. In Tables 3 and 4, the samples judged to be defective were each indicated by a symbol "Poor", whereas the ones judged to be conforming items were each indicated by a symbol "Good".

A destruction test to be conducted subsequent to chip component mounting will be explained hereinafter.

After a silicon chip was flip-chip mounted, the presence or absence of chip breakage subsequent to the mounting was checked by examining the surface of the mounted silicon chip with use of an ultrasonic microscope and an X-ray microscope for minute part. The results of the test were listed in Tables 3 and 4. In Tables 3 and 4, the samples judged to suffer from chip cracking were each indicated by a symbol "Poor", whereas the ones judged to be free from chip cracking were each indicated by a symbol "Good".

The test sample used in the testing is a mounting structure constituted by mounting, on the experimentally-produced circuit board having formed thereon a bump, a silicon chip formed by using diamond-like carbon (DLC, for short) which is one of Low-k materials. Since a Low-k material-made silicon chip is low in strength, in general, there is a tendency of the Low-k material portion to be broken due to thermal-expansion-coefficient mismatch between the mounted silicon chip and the circuit board. In contrast, in the mounting structure employing the circuit board of the invention, occurrence of silicon chip breakage could be prevented. Note that, in the circuit boards numbered 12 and 13, although there was no sign of silicon chip breakage, the substrate underwent significant deformation and a failure of silicon chip mounting was detected.

Next, a circuit board 1B implemented by way of a third embodiment of the invention will be described. The circuit board 1B of this embodiment (hereinafter also referred to as "the second circuit board") is analogous to the first circuit board 1 described previously with reference to FIGS. 1 to 6. Therefore, the components constituting the second circuit board 1B of this embodiment that play the same or corresponding roles as in the above-described first circuit board 1 will be identified with the same reference symbols. In terms of configuration, only the points of difference are described and thus the points of similarity may be omitted.

Figure 7:
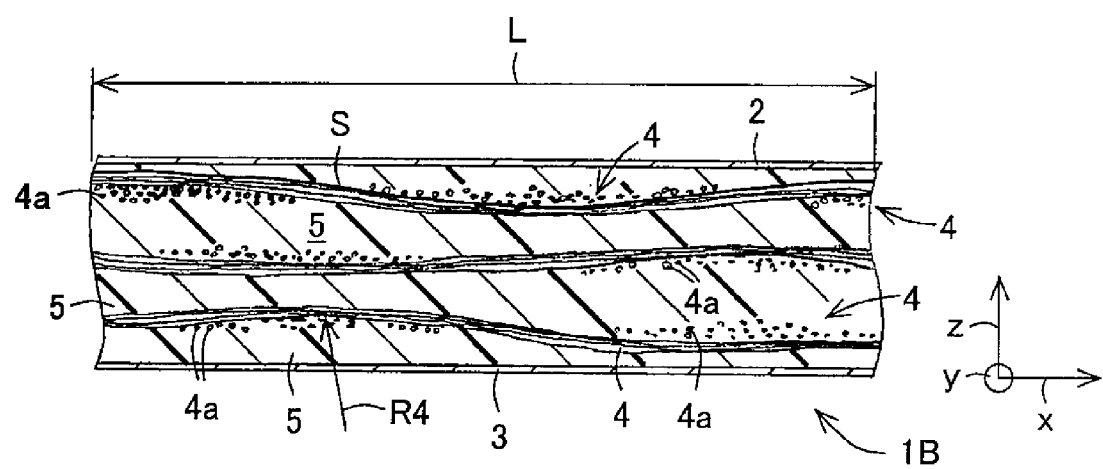
FIG. 7 is a sectional view of a circuit board in accordance with a third embodiment of the invention.
Figure 9A:
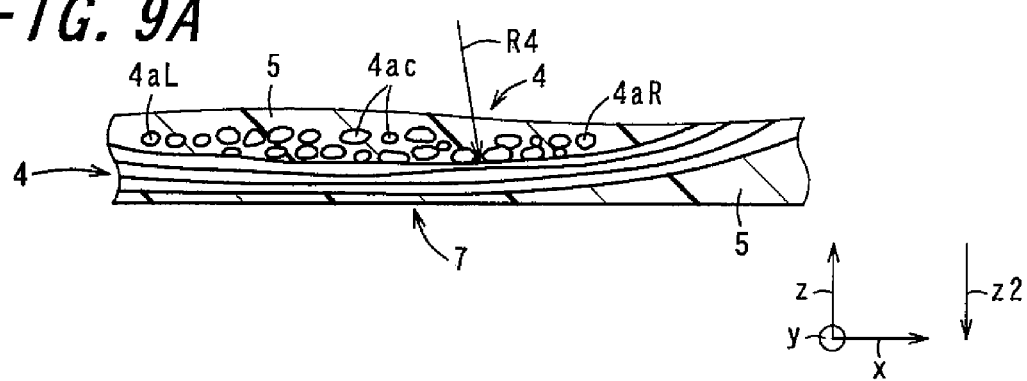
Figure 10:
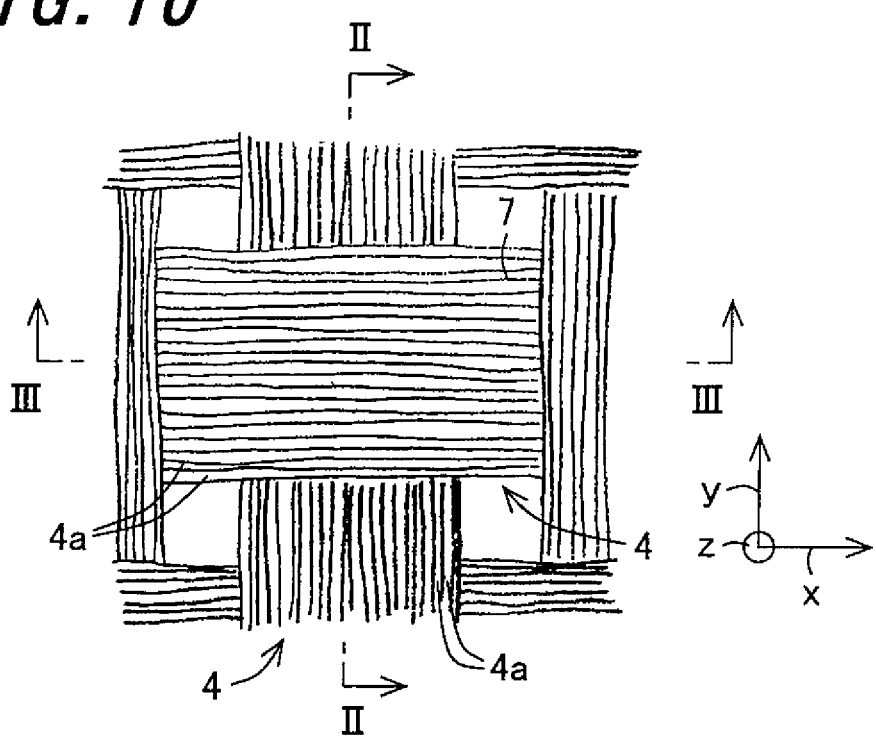
FIG. 10 is a plan view showing a region where fabric cloth portions woven in two directions cross each other, and so forth.

FIG. 7 is a sectional view of the second circuit board 18 according to this embodiment of the invention. FIGS. 8A and 8B are sectional views of the second circuit board 1B according to this embodiment of the invention (sectional views taken along the section line of FIG. 10), with FIG. 8A showing a sectional view of a principal portion thereof and FIG. 8B showing an enlarged sectional view of the principal portion. FIGS. 9A and 9B are sectional views of the second circuit board 1B according to this embodiment of the invention (sectional views taken along the section line of FIG. 10), with FIG. 9A showing a sectional view of the principal portion thereof and FIG. 9B as well as FIG. 9A showing an enlarged sectional view of the principal portion. FIG. 10 is a plan view showing a region where the fabric cloth 4 portions woven in two directions cross each other, namely a crossing region 7, and so forth.

Figure 11:
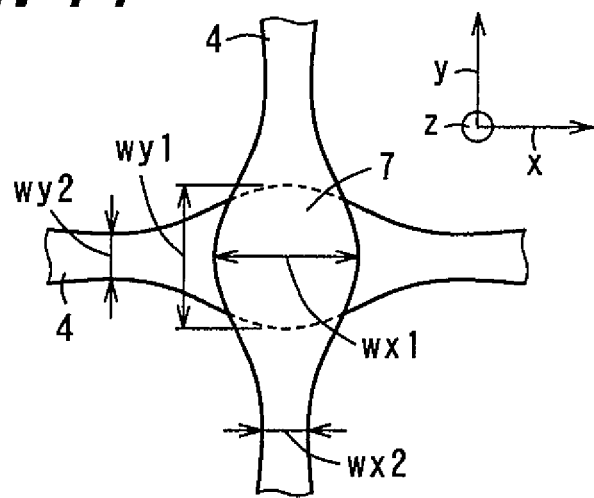
FIG. 11 is a partial plan view of a fabric cloth, schematically illustrating a state where single fibers cross each other.
Figure 12:
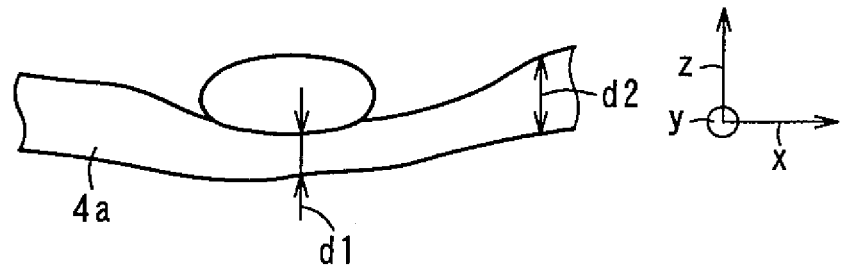
FIG. 12 is a sectional view of the fabric cloth depicted in FIG. 11.

FIG. 11 is a partial plan view of the fabric cloth 4, schematically illustrating a state where the single fibers 4a cross each other. FIG. 12 is a sectional view of the fabric cloth 4 depicted in FIG. 11.

As shown in FIG. 11, the resin fabric cloth 4 is so designed that an x-directional width wx1 (or a y-directional width wy1) in the crossing region where the x-directional single fiber and the y-directional single fiber cross each other is larger than an x-directional width wx2 (or a y-directional width wy2) in the noncrossing region where the single fibers do not cross each other. Moreover, as shown in FIG. 12, the resin fabric cloth 4 is so designed that a z-directional thickness d1 in the crossing region where the x-directional single fiber and the y-directional single fiber cross each other is smaller than a z-directional thickness d2 in the noncrossing region where the single fibers do not cross each other. That is, in the resin fabric cloth 4, its sectional profile in the crossing region 7 is made more flatly than that in the noncrossing region.

The degree of undulation of the single fiber 4a in the z direction is smaller than that in the conventional art. The larger is the undulation, the more likely it is that a springy effect is exerted by the single fiber 4a. As a result, even if a low-thermal-expansion material is utilized as the material used for the single fiber 4a, the effect of keeping the thermal expansion coefficient of the board as a whole low becomes inconveniently lessened.

In this embodiment, the undulation value S/L of the fabric cloth 4 is, just as is the case with the preceding embodiment, greater than 1 time but smaller than or equal to 1.20 times under the condition that the resin fabric cloth 4 or the like is press-molded by a rolling-type pressing apparatus 30.

Moreover, just as is the case with the preceding embodiment, optimally the undulation value S/L should fall in a numerical range of "1.02" or above and "1.10" or below.

As will hereinafter be described, by fulfilling certain conditions related to a pressing force required for press-molding the fabric cloth, the number of times for press-molding, a heating temperature set for press-molding, etc., it is possible to keep the undulation value in the optimal numerical range of "1.02" or above and "1.10" or below. As shown in FIGS. 8A, 8B, 9A, and 9B, in the crossing region 7 where the single fibers 4a cross each other, in contrast to the noncrossing region, the fiber bundle is formed in such a manner that the cross-sectional profile of the fiber bundle sectioned along a virtual plane perpendicular to its longitudinal direction takes on a flat shape elongated in the x direction (or the y direction).

As shown in FIGS. 8B and 9B in particular, a single fiber 4ac disposed near the midportion of the crossing region 7 in the y direction is, in contrast to a single fiber 4aL and a single fiber 4aR disposed near the end portions of the crossing region 7 in the y direction, respectively, made to have a wide, flat-shaped sectional profile. That is, the area of contact with the single fiber 4a extending in the y direction in the midportion is larger than that in the end portion in the y direction.

Accordingly, the "springy effect" exerted by the single fiber 4a in the crossing region 7 can be lessened even further. Moreover, since a large contact area is secured in the crossing region 7, it is possible to increase the strength of intimate contact between the single fiber 4a extending in the x direction and the single fiber 4a extending in the y direction. Further, since the fabric cloth 4 composed of a multiplicity of the single fibers 4a is spreadingly flattened on an xy plane, it is possible to increase the strength of intimate contact between the fabric cloth 4 and the resin portion 5.

As the single fiber 4a of the second circuit board 1B, a single fiber 4a having the same Young's modulus and linear expansion coefficient as adopted in the first circuit board 1 is applicable. Moreover, as the resin portion 5 for covering the resin fabric cloth 4 of the second circuit board 1B, a single fiber 4a having the same Young's modulus and linear expansion coefficient as adopted in the first circuit board 1 is applicable.

Next, a method for manufacturing the second circuit board 1B will be explained hereinafter.

Figure 13:
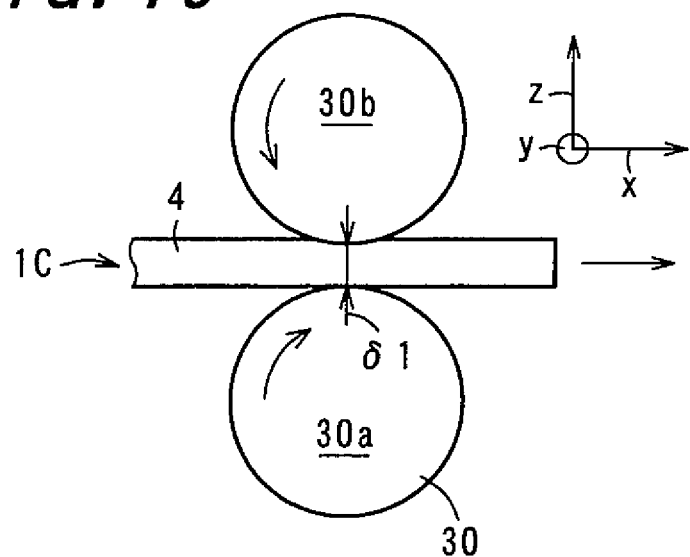
FIG. 13 is a view showing a state where a resin fabric cloth or a resin sheet is being press-molded by a pressing apparatus.
Figure 14:
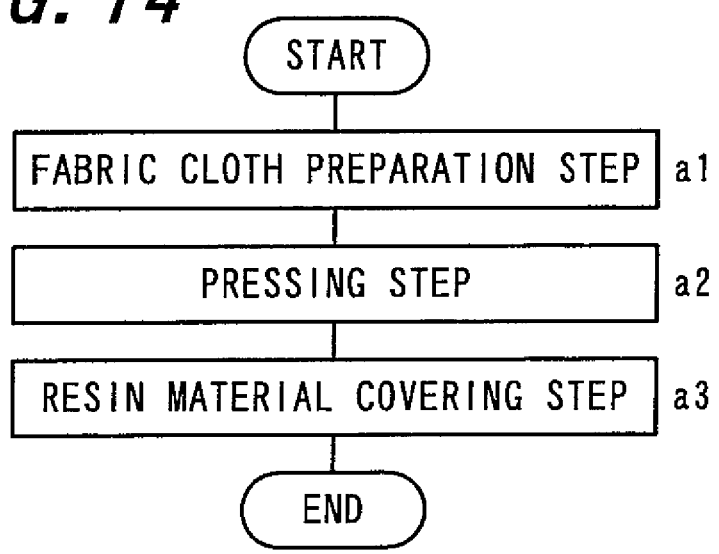
FIG. 14 is a flow chart showing a method for manufacturing a circuit board.

FIG. 13 is a view showing a state where the resin fabric cloth 4 or a resin sheet is being press-molded by the pressing apparatus 30. FIG. 14 is a flow chart showing a method for manufacturing the second circuit board 1B.

The method for manufacturing the second circuit board 1B according to this embodiment comprises a step of preparing the resin fabric cloth 4 (Step a1), a step of pressing the resin fabric cloth 4 (Step a2), and a step of covering the pressed resin fabric cloth 4 with a resin material (Step a3).

In the step of preparing the resin fabric cloth 4, a resin fabric cloth 4 composed of resin-made single fibers 4a is prepared for use. This resin fabric cloth 4 is a sheet-like woven cloth formed by arranging a plurality of single fibers 4a in the x direction and the y direction so that the single fibers 4a intersect one another. At this point in time, the undulation value S/L of the resin fabric cloth 4 generally takes on a value larger than "1.20".

Next, the procedure proceeds to the step of pressing the resin fabric cloth 4, where the prepared resin fabric cloth 4 is hot-pressed in a direction perpendicular to the plane thereof with use of the pressing apparatus 30 acting as pressure-applying means. In this way, the width of the single fiber 4a in the crossing region 7 where the single fibers 4a cross each other is made larger than the width of the single fiber 4a in the noncrossing region where the single fibers 4a do not cross each other, and correspondingly the thickness of the single fiber 4a in the crossing region 7 where the single fibers 4a cross each other is made smaller than the thickness of the single fiber 4a in the noncrossing region where the single fibers 4a do not cross each other. Through this pressing step, the undulation value S/L of the resin fabric cloth 4 is adjusted to be greater than 1 but smaller than or equal to 1.20 times.

The pressing apparatus 30 includes a pair of roller members 30a and 30b that are arranged in parallel, with a predetermined spacing 61 secured therebetween; a driving source for rotationally driving these roller members 30a and 30b; heating means capable of applying heat to the prepared resin fabric cloth 4; and control means for exercising drive control over the driving source and exercising temperature control over the heating means. Upon the prepared resin fabric cloth 4 being fed from the upstream side with respect to the conveyance direction of the pressing apparatus 30 to the region between the pair of roller members 30a and 30b, the roller members 30a and 30b are rotated by the driving source, and the resin fabric cloth 4 is heated by the heating means. In this way, there is formed a resin fabric cloth 4 having a thickness of 64% or above and 83% or below of the thickness in the z direction of the resin fabric cloth 4 before the pressing step. By keeping the resin fabric cloth 4 under compression in that way, it is possible for the resin fabric cloth 4 to be wholly accommodated in the resin portion 5 in the subsequent resin-material covering step (refer to FIG. 7).

Note that it is possible to use, as the pressing apparatus 30, for example, an apparatus so designed that the roll width of the roller members 30a, 30b (the dimension of the roller members 30a, 30b shown in FIG. 11 in the y direction) is 500 mm, the maximum load is 45 ton/cm, and the feeding speed is 1 m/min. Table 5 is a table showing data such as the thicknesses of the resin fabric cloth measured before and after the processing steps performed by using the pressing apparatus 30.

TABLE 5

| Temperature (° C.) | Linear pressure (kg/cm) | Number of times | Measurement point | Before-processing thickness (μm) | After-processing thickness (μm) | Compressive thickness (μm) | Average |
|---|---|---|---|---|---|---|---|
| Ordinary temperature | 500 | 1 | (1) | 92 | 71 | 21 | 22 |
| | | | (2) | 95 | 73 | 22 | |
| | | | (3) | 96 | 73 | 23 | |
| | 800 | 1 | (1) | 94 | 70 | 24 | 24 |
| | | | (2) | 88 | 67 | 21 | |
| | | | (3) | 92 | 66 | 26 | |
| | 1000 | 1 | (1) | 97 | 67 | 30 | 27 |
| | | | (2) | 96 | 70 | 26 | |
| | | | (3) | 98 | 72 | 26 | |
| 100 | 500 | 1 | (1) | 90 | 56 | 34 | 32 |
| | | | (2) | 94 | 63 | 31 | |
| | | | (3) | 97 | 65 | 32 | |
| | 800 | 1 | (1) | 85 | 57 | 28 | 30 |
| | | | (2) | 95 | 62 | 33 | |
| | | | (3) | 86 | 57 | 29 | |
| | 1000 | 1 | (1) | 87 | 61 | 26 | 29 |
| | | | (2) | 90 | 58 | 32 | |
| | | | (3) | 91 | 62 | 29 | |
| | | 2 | (1) | 89 | 57 | 32 | 35 |
| | | | (2) | 88 | 55 | 33 | |
| | | | (3) | 92 | 53 | 39 | |
| | | 3 | (1) | 92 | 50 | 42 | 41 |
| | | | (2) | 92 | 51 | 41 | |
| | | | (3) | 91 | 52 | 39 | |
| 200 | 500 | 1 | (1) | 98 | 72 | 26 | 26 |
| | | | (2) | 99 | 71 | 28 | |
| | | | (3) | 94 | 69 | 25 | |
| | 800 | 1 | (1) | 89 | 56 | 33 | 32 |
| | | | (2) | 89 | 55 | 34 | |
| | | | (3) | 86 | 57 | 29 | |
| | 1000 | 1 | (1) | 92 | 62 | 30 | 32 |
| | | | (2) | 95 | 59 | 36 | |
| | | | (3) | 90 | 60 | 30 | |

In Table 5, "Temperature" refers to the temperature at which the resin fabric cloth 4 subjected to a pressing operation is heated. "Linear pressure" refers to a load per unit length of the roll width in the y direction. "Number of times" refers to how many times the resin fabric cloth 4 is pressed with use of the pressing apparatus 30. "Measurement point" refers to measurement points (1), (2), and (3) that differ from one another. "Before-processing thickness" refers to the thickness of the resin fabric cloth 4 prior to its being pressed by the pressing apparatus 30. The measurement of the resin fabric cloth 4 thickness is conducted at the measurement points (1) through (3), respectively. "After-processing thickness" refers to the thickness of the resin fabric cloth 4 subsequent to its being pressed by the pressing apparatus 30. The measurement of the resin fabric cloth 4 thickness is conducted at the measurement points (1) through (3), respectively. "Compressive thickness" refers to the value of thickness obtained by subtracting "After-processing thickness" from "Before-processing thickness" at each of the measurement points. For example, under the condition that the before-processing thickness of the resin fabric cloth 4 at the measurement point (1) is 92 μm, the resin fabric cloth 4 is pressed one time, with the temperature of the resin fabric cloth 4 set at an ordinary temperature (approximately 25° C.) and with the linear pressure of the pressing apparatus 30 set at 500 kg/cm. At this time, the after-processing thickness of the resin fabric cloth 4 at the measurement point (1) is found to be 71 μm. In this case, "21 μm", which is a value obtained by subtracting the after-processing thickness 71 μm from the before-processing thickness 92 μm, is derived as a compressive thickness. "Average" refers to an average value of the compressive thicknesses obtained at the measurement points (1), (2), and (3), respectively.

As will be understood from the results shown in Table 5, it is preferable that the heating temperature is from 100° C. to 200° C. and the linear pressure is from 800 kg/cm to 1000 kg/cm.

After the resin fabric cloth 4 is pressed, the procedure proceeds to the step of covering the resin fabric cloth 4 with a resin material. In this step, at first, a resin material for constituting the resin portion 5 is prepared for use. The resin material is mixed with silane coupling-treated spherical silica powder and a solvent, whereupon a varnish is formed. Then, the fabric cloth is impregnated with the varnish thereby formed to form a resin sheet (prepreg).

Subsequently, a plurality of resin sheets obtained are stacked one upon another, and a copper foil is laminated on each of the upper and back surfaces of the stacked body, whereupon a resin layered body 1C is formed. This resin layered body 10 is hot-pressed in the direction of thickness of the board with use of the pressing apparatus 30 thereby to form a both-side copper-clad substrate.

Following the formation of the both-side copper-clad substrate, a through-hole is created with use of a tool such as a laser apparatus or a drill. Then, by means of electroless plating and electrolytic plating, the through-hole conductor 16 is formed inside the through-hole. Moreover, the copper foil is processed into a predetermined pattern by means of photolithography and etching. In this way, the manufacture of the second circuit board is completed.

After that, the insulating layer 14 may be laminated on the circuit board thus obtained by the build-up method described earlier so as to produce a multi-layer board.

For example, the thickness of the multi-layer board falls in a range of 400 μm or above and 500 μm or below, and the thickness of the circuit layer falls in a range of 5 μm or above and 18 μm or below. Moreover, in the case of using copper for the circuit layer, the circuit layer has a linear expansion coefficient of 16 ppm/° C. In this case, it is preferable that the thermal expansion coefficient of the insulating resin falls in a range of 20 ppm/° C. or above and 40 ppm/° C. or below, for example.

According to the second circuit board 1B thus far described, the resin fabric cloth 4, which is formed by arranging a plurality of single fibers 4a in the x direction and the y direction so that the single fibers 4a intersect one another, is covered with the resin portion 5 made of a resin material. In the single-fiber crossing region 7, in contrast to the single-fiber noncrossing region, the single fiber 4a has a horizontally-long, flat-shaped configuration. That is, the single fiber 4a is so designed that the x-directional or y-directional width in the crossing region 7 where the single fibers 4a cross each other is made larger than the x-directional or y-directional width in the noncrossing region where the single fibers 4a do not cross each other. Moreover, the single fiber 4a is so designed that the y-directional thickness in the crossing region 7 where the single fibers 4a cross each other is made smaller than the y-directional thickness in the noncrossing region where the single fibers 4a do not cross each other. Accordingly, the following advantages are gained.

Since the degree of undulation in the single fiber 4a is decreased, it is possible to prevent, insofar as possible, the resin fabric cloth 4 from extending in the longitudinal direction of the single fiber 4a. As a result, the expansion of the resin portion 5 in the x direction or the y direction can be prevented successfully by the resin fabric cloth 4.

Moreover, since the area of contact between the single fibers 4a extending in the x direction and the y direction is made larger than that in the conventional art, it follows that the frictional resistance provided between the single fibers 4a is increased. This makes it possible to prevent, insofar as possible, the single fiber 4a from undergoing positional deviation in the x direction or the y direction, as well as to render the fiber bundles uniform with respect to the board as a whole.

The resin fabric cloth 4 is pressed by the pressing apparatus 30 before it is impregnated with the varnish. In this case, the undulation of the resin fabric cloth 4 becomes less significant than that in the conventional art. Accordingly, even if the thickness of the resin portion 5 is reduced, it never occurs that the resin fabric cloth 4 is exposed from the resin portion 5, and thus the resin fabric cloth 4 can properly be housed in the resin portion 5 interiorly thereof. This makes it possible to prevent occurrence of contact between the resin fabric cloth 4 and the circuit conductor that will eventually cause separation of the circuit conductor.

Moreover, since the resin portion 5 layer can be made as thin as possible, it is possible to keep the ratio of the resin fabric cloth 4 to the board as a whole as high as possible. Accordingly, lowness of thermal expansion in the circuit board as a whole can be achieved while enhancing the rigidity/strength of the circuit board.

As has already been described, since the resin fabric cloth 4 assumes a flat shape in the single-fiber 4 crossing region 7, when a through-hole is created in the substrate by means of a drill, displacement of a drill bit of the drill (so-called drill-bit slipping) can be prevented. This makes it possible to attain enhanced productivity. Moreover, in the resin fabric cloth 4, since the undulation value of the single fiber Lla is smaller than that in the conventional art, it is possible to lessen the springy effect and thereby make the most of the advantage of the use of low-thermal-expansion-coefficient fibers.

The invention is not particularly limited to the above-described embodiments and therefore various changes and modifications are possible.

For example, by way of another form of the third embodiment, there may be a case where a pressing apparatus devoid of heating means is used. In this case, the resin layered body is heated to a predetermined temperature by a heating furnace and is then subjected to pressure in the pressing apparatus devoid of heating means. Moreover, the resin layered body may be pressed in the direction of thickness of the board with use of a die including top and bottom molds. In this case, it is possible to attain higher thickness dimensional accuracy in the processed board than in the case of using a rolling-type pressing apparatus.

According to this embodiment, in the second circuit board 1B manufacturing method, after a predetermined number of resin sheets are stacked together, they are pressed. Alternatively, it is also possible that, for example, a plurality of resin sheets are pressed separately on an individual basis and are then stacked together, and thereafter the stacked resin sheets are pressed once again. In this case, it is possible to keep the undulation value of the single fiber constituting each layer of the circuit board in the optimal numerical range of "1.02" or above and "1.10" or below with ease.

While, in the embodiments thus far described, the fiber bundles are arranged in two directions: the x direction and the y direction, the arrangement direction is not limited to these two directions. For example, there may be a case where the fiber bundles are arranged and woven in three or more directions. In this case, as compared with the case of adopting the two-direction arrangement, higher rigidity and strength can be attained for the circuit board. Note that, although the fiber bundles arranged in two directions are defined as being perpendicular to the z direction, sometimes they do not cross each other perpendicularly.

Moreover, there may be a case where the single fiber has, on its surface region, a plurality of grooves formed along the axial direction thereof in circumferentially spaced relation. According to this single fiber, as compared with the single fiber having a single streak of groove, the area of contact between the fiber and the resin portion is increased considerably, wherefore the strength of bonding between them can be raised even further. This helps reduce the possibility of separation between the fiber and the resin portion. Note that the nonmetallic inorganic filler does not necessarily have to be spherical silica. Also in a case of using, for example, non-spherical silica, substantially the same effects as achieved in this embodiment can be obtained. Moreover, while, in this embodiment, a silicon chip is mounted on the circuit board, a chip to be mounted is not limited to a silicon chip, but may be of the equivalent of a silicon chip.

While, in the embodiments thus far described, a plurality of single fibers 4a constitute the fiber bundle, the single fibers 4a do not necessarily have to be used to constitute the fiber bundle. It is also possible for the single fibers 4a to be arranged in the x direction and the y direction so as to constitute a fabric cloth.

Not only it is possible to combine the constituent components specifically explained in the description as to the embodiments, but it is also possible to combine the different embodiments in part so long as the combination poses no special problem.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A circuit board comprising:
an insulating substrate; and
an electrically conductive section formed on the insulating substrate, to which a chip component is electrically to be connected; wherein
the insulating substrate comprises a base material having a fiber bundle composed of a plurality of single fibers, and a resin portion for covering the base material,
the single fiber comprises a resin material which is smaller in linear expansion coefficient than a material used for the chip component,
the resin portion is made of a resin material which is larger in linear expansion coefficient than the material used for the chip component,
the base material is composed of a fabric cloth formed by weaving the single fibers or the fiber bundles together, and
the fiber bundle is formed in such a manner that a cross-sectional profile of the fiber bundle sectioned along a virtual plane perpendicular to its longitudinal direction is in a horizontally long, flat shape,
wherein a linear expansion coefficient in the longitudinal direction of the single fiber falls in a range of −10 ppm/° C. or above and 0 ppm/° C. or below (25° C. or above and 200° C. or below) and the linear expansion coefficient of the resin portion falls in a range of 10 ppm/° C. or above and 60 ppm/° C. or below (25° C. or above and 200° C. or below).

2. A mounting structure comprising:
the circuit board of claim 1; and
the chip component which is a semiconductor element flip-chip mounted on the circuit board.

3. A circuit board comprising:
an insulating substrate; and
an electrically conductive section formed on the insulating substrate, to which a chip component is electrically to be connected; wherein
the insulating substrate comprises a base material having a fiber bundle composed of a plurality of single fibers, and a resin portion for covering the base material,
the single fiber comprises a resin material which is smaller in linear expansion coefficient than a material used for the chip component,
the resin portion is made of a resin material which is larger in linear expansion coefficient than the material used for the chip component,
the base material is composed of a fabric cloth formed by weaving the single fibers or the fiber bundles together, and
the fiber bundle is formed in such a manner that a cross-sectional profile of the fiber bundle sectioned along a virtual plane perpendicular to its longitudinal direction is in a horizontally long, flat shape,
wherein the single fiber has, on its surface region, a groove formed along a longitudinal direction thereof.

4. A mounting structure comprising:
the circuit board of claim 3; and
the chip component which is a semiconductor element flip-chip mounted on the circuit board.

* * * * *